US009848144B2

(12) United States Patent
Okamoto et al.

(10) Patent No.: US 9,848,144 B2
(45) Date of Patent: Dec. 19, 2017

(54) SEMICONDUCTOR DEVICE, IMAGING DEVICE, AND ELECTRONIC DEVICE

(71) Applicant: SEMICONDUCTOR ENERGY LABORATORY CO., LTD., Kanagawa-ken (JP)

(72) Inventors: Yuki Okamoto, Kanagawa (JP); Munehiro Kozuma, Kanagawa (JP); Yoshiyuki Kurokawa, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 205 days.

(21) Appl. No.: 14/799,006

(22) Filed: Jul. 14, 2015

(65) Prior Publication Data
US 2016/0021319 A1    Jan. 21, 2016

(30) Foreign Application Priority Data

Jul. 18, 2014 (JP) ................................. 2014-147695

(51) Int. Cl.
*H04N 5/363* (2011.01)
*H01L 27/146* (2006.01)
(Continued)

(52) U.S. Cl.
CPC ....... *H04N 5/363* (2013.01); *H01L 27/14612* (2013.01); *H01L 27/14627* (2013.01);
(Continued)

(58) Field of Classification Search
CPC ................. H04N 5/363; H04N 5/3745; H01L 27/14627; H01L 27/14643
USPC ................................ 250/208.1; 257/290–292
See application file for complete search history.

(56) References Cited

U.S. PATENT DOCUMENTS

| 5,731,856 A | 3/1998 | Kim et al. |
| 5,744,864 A | 4/1998 | Cillessen et al. |

(Continued)

FOREIGN PATENT DOCUMENTS

| EP | 1737044 A | 12/2006 |
| EP | 2226847 A | 9/2010 |

(Continued)

OTHER PUBLICATIONS

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

(Continued)

*Primary Examiner* — Seung C Sohn
(74) *Attorney, Agent, or Firm* — Husch Blackwell LLP

(57) ABSTRACT

A novel semiconductor device, a semiconductor device where influence of noise is lessened, or a semiconductor device with high reliability is provided. A first circuit has a function of generating an optical data signal in accordance with the amount of irradiation light and a function of generating a reset signal corresponding to a reset state of the first circuit. A second circuit has a function of controlling output of the optical data signal and the reset signal from the first circuit to a fourth circuit. A third circuit has a function of controlling generation of the reset signal to be output from the first circuit to the fourth circuit. The fourth circuit has a function of calculating the difference between the optical data signal input from the first circuit and the reset signal input from the first circuit after input of the optical data signal.

16 Claims, 18 Drawing Sheets

(51) Int. Cl.
*H04N 5/357* (2011.01)
*H04N 5/378* (2011.01)

(52) U.S. Cl.
CPC .. *H01L 27/14643* (2013.01); *H01L 27/14665* (2013.01); *H04N 5/3575* (2013.01); *H04N 5/378* (2013.01)

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,650,369 B2 * | 11/2003 | Koizumi ............ H01L 27/14609 257/E27.132 |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,102,115 B2 * | 9/2006 | Machida ............... H04N 3/1568 250/208.1 |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,461,590 B2 | 6/2013 | Tamura et al. |
| 8,586,905 B2 | 11/2013 | Kurokawa |
| 8,654,231 B2 | 2/2014 | Kurokawa et al. |
| 8,674,972 B2 | 3/2014 | Kurokawa et al. |
| 8,698,782 B2 | 4/2014 | Kurokawa |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0176038 A1 | 7/2011 | Kurokawa et al. |
| 2011/0220889 A1 | 9/2011 | Kurokawa et al. |
| 2011/0221723 A1 | 9/2011 | Kurokawa et al. |
| 2012/0002090 A1 | 1/2012 | Aoki et al. |
| 2013/0015326 A1 | 1/2013 | Tamura |
| 2013/0016035 A1 | 1/2013 | Ikeda |
| 2013/0075594 A1 | 3/2013 | Kozuma |
| 2013/0321366 A1 | 12/2013 | Kozuma et al. |
| 2014/0054466 A1 | 2/2014 | Kurokawa et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-104186 A | 4/2007 |
| WO | WO-2004/114391 | 12/2004 |

OTHER PUBLICATIONS

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

(56) References Cited

OTHER PUBLICATIONS

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,Or Zn] at Temperatures Over 1000° C.", Journal of Solid State Chemistry, 1985, vol. 60, pp. 382-384.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs", IDW '02 : Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Lee.H et al., "Current Status of, Challenges to, and Perspective View of AM-OLED", IDW '06 : Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Park.S et al., "Challenge to Future Displays: Transparent AM-OLED Driven by Peald Grown ZnO TFT", IMID '07 Digest, 2007, pp. 1249-1252.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, vol. 38, pp. 1737-1740.

Miyasaka.M, "Suftla Flexible Microelectronics on Their Way to Business", SID Digest '07 : SID International Symposium Digest of Technical Papers, 2007, vol. 38, pp. 1673-1676.

Kurokawa.Y et al., "UHF RFCPUS on Flexible and Glass Substrates for Secure RFID Systems", Journal of Solid-State Circuits, 2008, vol. 43, No. 1, pp. 292-299.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Sakata.J et al., "Development of 4.0-In, AMOLED Display With Driver Circuit Using Amorphous In—Ga—Zn-Oxide TFTs", IDW '09 : Proceedings of the 16th International Display Workshops, 2009, pp. 689-692.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Park.J et al., "High performance amorphous oxide thin film transistors with self-aligned top-gate structure", IEDM 09: Technical Digest of International Electron Devices Meeting, Dec. 7, 2009, pp. 191-194.

(56) References Cited

OTHER PUBLICATIONS

Nakamura.M, "Synthesis of Homologous Compound with New Long-Period Structure", NIRIM Newsletter, Mar. 1, 1995, vol. 150, pp. 1-4.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Orita.M et al., "Mechanism of Electrical Conductivity of Transparent $InGaZnO_4$", Phys. Rev. B (Physical Review. B), Jan. 15, 2000, vol. 61, No. 3, pp. 1811-1816.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Orita.M et al., "Amorphous transparent conductive oxide $InGaO_3(ZnO)_m$ (m<4):a Zn4s conductor", Philosophical Magazine, 2001, vol. 81, No. 5, pp. 501-515.

Janotti.A et al., "Oxygen Vacancies in ZnO", Appl. Phys. Lett. (Applied Physics Letters), 2005, vol. 87, pp. 122102-1-122102-3.

Clark.S et al., "First Principles Methods Using CASTEP", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors By Ar Plasma Treatment", Appl. Phys. Lett. (Applied Physics Letters), Jun. 26, 2007, vol. 90, No. 26, pp. 262106-1-262106-3.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B (Physical Review. B) 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT", SID Digest '08 : SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on $SrTiO_3$ With Sputtered $Al_2O_3$ Gate Insulator", Appl. Phys. Lett. (Applied Physics Letters), Sep. 1, 2003, vol. 83, No. 9, pp. 1755-1757.

Nomura.K et al., "Carrier transport in transparent oxide semiconductor with intrinsic structural randomness probed using single-crystalline $InGaO_3(ZnO)_5$ films", Appl. Phys. Lett. (Applied Physics Letters), Sep. 13, 2004, vol. 85, No. 11, pp. 1993-1995.

\* cited by examiner

SEMICONDUCTOR DEVICE, IMAGING DEVICE, AND ELECTRONIC DEVICE

BACKGROUND OF THE INVENTION

1. Field of the Invention

One embodiment of the present invention relates to a semiconductor device, an imaging device, and an electronic device.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. Another embodiment of the present invention relates to a semiconductor device, a display device, a lighting device, a power storage device, a memory device, or a driving method or manufacturing method thereof.

2. Description of the Related Art

In recent years, technological development of a photodetector which inputs data with the use of a photodetector circuit (also referred to as an optical sensor) capable of generating data having a value corresponding to the illuminance of incident light, a photodetector which inputs data with the use of the photodetector circuit and outputs data in accordance with the input data, and the like has been advanced.

As an example of the photodetector, an image sensor can be given. As examples of the image sensor, a charge coupled device (CCD) image sensor, a complementary metal oxide semiconductor (CMOS) image sensor, and the like can be given (e.g., Patent Document 1).

In a photodetector circuit in a CMOS image sensor, a correlated double sampling (CDS) circuit is provided in some cases. The CDS circuit calculates the difference between data at the time of photodetection and data at the time of reset operation, which can reduce various kinds of noise.

As a driving system of CMOS image sensors, there are a rolling shutter system and a global shutter system. In a rolling shutter system, a plurality of photodetector circuits arranged in row and column directions are sequentially exposed to light row by row. In a global shutter system, photodetector circuits in all the rows are exposed to light at once.

REFERENCE

Patent Document

[Patent Document 1] Japanese Published Patent Application No. 2007-104186

SUMMARY OF THE INVENTION

Conventional photodetectors have a problem of large variations of generated data due to noise, or the like. Examples of the noise are random noise and fixed pattern noise. As random noise, reset noise can be given, for example. Reset noise is included in an optical data signal generated by a photodetector circuit. The random noise is generated because of connection resistance between elements in a photodetector circuit, for example. Fixed pattern noise is generated because of variations in electrical characteristics of elements in a photodetector, for example.

When a photodetector which is to be mounted on a small device such as a mobile phone is further miniaturized, a light receiving area is reduced and thus the amount of photocurrent generated in accordance with the amount of received light is reduced. Accordingly, the adverse effects of leakage current and noise become considerable, which makes it difficult to obtain correct data (to accurately capture an image).

Although a CDS circuit reads an optical data signal and a reset signal alternately to calculate the difference therebetween, it is difficult to read an optical data signal and a reset signal alternately if one-shot exposure is performed with a global shutter system.

An object of one embodiment of the present invention is to provide a novel semiconductor device. Another object of one embodiment of the present invention is to provide a semiconductor device in which influence of noise is lessened. Another object of one embodiment of the present invention is to provide a highly reliable semiconductor device. Another object of one embodiment of the present invention is to provide a semiconductor device capable of reducing power consumption. Another object of one embodiment of the present invention is to provide a semiconductor device with reduced area.

One embodiment of the present invention does not necessarily achieve all the objects listed above and only needs to achieve at least one of the objects. The description of the above objects does not disturb the existence of other objects. Other objects are apparent from and can be derived from the description of the specification, the drawings, the claims, and the like.

One embodiment of the present invention is a novel structure and a novel driving method of a semiconductor device capable of photodetection.

Specifically, the semiconductor device of one embodiment of the present invention includes a driving circuit with a function of reading an optical data signal and a driving circuit with a function of resetting photodetector circuits, and conducts reset operation on the photodetector circuits row by row. In addition, a reset signal is generated in the photodetector circuit by the reset operation using the driving circuit, and the difference between the optical data signal and the reset signal is calculated.

In the semiconductor device of one embodiment of the present invention, an optical data signal and a reset signal are alternately read and the difference therebetween is calculated when a global shutter system is employed.

A semiconductor device of one embodiment of the present invention includes a first circuit, a second circuit, a third circuit, and a fourth circuit. The first circuit includes a photoelectric conversion element, and has a function of generating a first signal in accordance with the amount of irradiation light on the photoelectric conversion element and a function of generating a second signal corresponding to a reset state of the first circuit. The second circuit has a function of controlling output of the first signal and the second signal from the first circuit to the fourth circuit. The third circuit has a function of controlling generation of the second signal to be output from the first circuit to the fourth circuit. The fourth circuit has a function of calculating the difference between the first signal input from the first circuit and the second signal input from the first circuit after the input of the first signal.

The semiconductor device of one embodiment of the present invention may have a structure in which the fourth circuit includes a capacitor, and in which the first signal and the second signal are input to one of electrodes of the capacitor, and the potential of the other of the electrodes of the capacitor changes in accordance with the second signal.

In the semiconductor device of one embodiment of the present invention, the first circuit may include a first transistor and a second transistor. One of a source and a drain of the first transistor may be electrically connected to the photoelectric conversion element, and the other of the source and the drain of the first transistor may be electrically connected to a gate of the second transistor. An oxide semiconductor may be included in a channel formation region of the first transistor.

The semiconductor device of one embodiment of the present invention may have a function of performing exposure and reading with a global shutter system.

An imaging device of one embodiment of the present invention may include a photodetector portion including the above-described semiconductor device, and a data processing portion with a function of generating an image data on the basis of a signal from the photodetector portion.

An electronic device of one embodiment of the present invention may include the above-described imaging device and any of a lens, a display portion, an operation key, and a shutter button.

According to one embodiment of the present invention, a novel semiconductor device can be provided. Alternatively, according to one embodiment of the present invention, a semiconductor device in which influence of noise is lessened can be provided. Alternatively, according to one embodiment of the present invention, a semiconductor device with high reliability can be provided. Further alternatively, a semiconductor device capable of reducing power consumption can be provided. Alternatively, according to one embodiment of the present invention, a semiconductor device with reduced area can be provided.

Note that the description of these effects does not disturb the existence of other effects. One embodiment of the present invention does not necessarily achieve all the effects listed above. Other effects will be apparent from and can be derived from the description of the specification, the drawings, the claims, and the like.

BRIEF DESCRIPTION OF THE DRAWINGS

In the accompanying drawings:

FIGS. 15A and 15B1 each illustrate an example of a cross-sectional structure of a semiconductor device;

DETAILED DESCRIPTION OF THE INVENTION

Figure 1A:
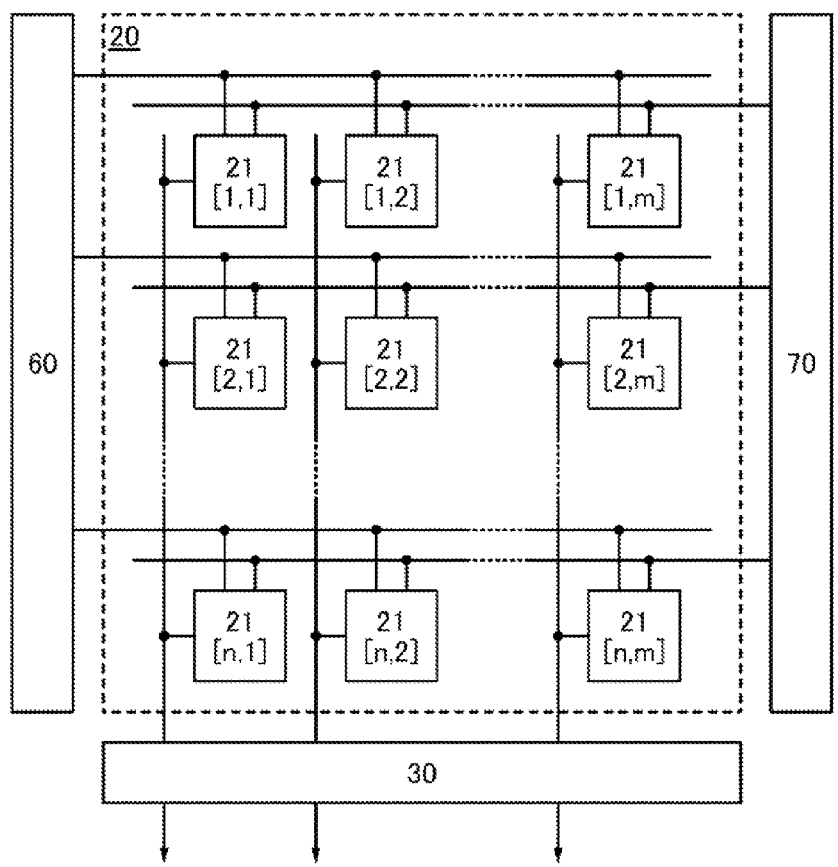
FIGS. 1A and 1B illustrate an example of a structure of a semiconductor device.

Hereinafter, embodiments of the present invention will be described below in detail with reference to the accompanying drawings. Note that the present invention is not limited to the following description and it is easily understood by those skilled in the art that the mode and details can be variously changed without departing from the scope and spirit of the present invention. Therefore, the present invention should not be interpreted as being limited to the description of embodiments below.

One embodiment of the present invention includes, in its category, devices such as an imaging device, a radio frequency (RF) tag, a display device, and an integrated circuit. The display device includes, in its category, a display device including an integrated circuit, such as a liquid crystal display device, a light-emitting device in which a light-emitting element typified by an organic light-emitting element is provided in each pixel, an electronic paper, a digital micromirror device (DMD), a plasma display panel (PDP), and a field emission display (FED).

In describing structures of the present invention with reference to the drawings, the same reference numerals are used in common for the same components in different drawings in some cases.

In this specification and the like, when it is explicitly described that X and Y are connected, the case where X and Y are electrically connected, the case where X and Y are functionally connected, and the case where X and Y are directly connected are included therein. Accordingly, another element may be provided between elements having a connection relation illustrated in drawings and texts, without limitation on a predetermined connection relation, for example, the connection relation illustrated in the drawings and the texts.

Here, X and Y each denote an object (e.g., a device, an element, a circuit, a line, an electrode, a terminal, a conductive film, a layer, or the like).

Examples of the case where X and Y are directly connected include the case where an element that allows an electrical connection between X and Y (e.g., a switch, a transistor, a capacitor, an inductor, a resistor, a diode, a display element, a light-emitting element, and a load) is not connected between X and Y, and the case where X and Y are connected without the element that allows the electrical connection between X and Y provided therebetween.

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. A switch is controlled to be on or off. That is, a switch is conducting or not conducting (is turned on or oft) to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable functional connection between X and Y (e.g., a logic circuit such as an inverter, a NAND circuit, or a NOR circuit: a signal converter circuit such as a DA converter circuit, an AD converter circuit, or a gamma correction circuit; a potential level converter circuit such as a power source circuit (e.g., a step-up converter, or a step-down converter) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a memory circuit; and/or a control circuit) can be connected between X and Y. Note that for example, in the case where a signal output from X is transmitted to Y even when another circuit is interposed between X and Y, X and Y are functionally connected. Note that the case where X and Y are functionally connected includes the case where X and Y are directly connected and the case where X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), or X and Y are directly connected (i.e., the case where X and Y are connected without another element or another circuit provided therebetween). That is, in this specification and the like, the explicit description "X and Y are electrically connected" is the same as the description "X and Y are connected".

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

Embodiment 1

In this embodiment, structure examples of a semiconductor device of one embodiment of the present invention are described. In a semiconductor device of one embodiment of the present invention, an optical data signal and a reset signal are read from a circuit 20, and a circuit 30 outputs the difference between the optical data signal and the reset signal, so that a signal in which influence of noise is lessened can be obtained. A semiconductor device with such a structure is described below.

<Structure Example of Semiconductor Device 10>

FIG. 1A illustrates a structure example of a semiconductor device 10 of one embodiment of the present invention. The semiconductor device 10 includes circuits 20, 30, 60, and 70.

The circuit 20 includes a plurality of circuits 21. The circuit 21 has a function of converting irradiation light into an electrical signal (hereinafter also referred to as an optical data signal) and outputting the signal. Here, the circuit 20 includes the circuits 21 (circuits 21[1,1] to 21[n,m])

arranged in n rows and m columns (n and m are natural numbers). The circuit 21 serves as a pixel (photodetector circuit) in the case of using the semiconductor device as an imaging device, and the circuit 20 serves as a pixel portion including a plurality of pixels. A period when detection of (exposure to) irradiation light from the outside is performed in the circuit 21 is hereinafter also referred to as an exposure period.

In addition, when the circuit 21 is in a reset state, the circuit 21 has a function of outputting an electrical signal corresponding to the reset state (hereinafter referred to as a reset signal). Here, a reset state refers to a state where the circuit 21 is set to a predetermined state, e.g., where a wiring whose potential is changed by light irradiation is precharged at a predetermined potential. Data output based on the potential of the precharged wiring is a reset signal. A period when the circuit 21 is in a reset state is hereinafter also referred to as a reset period.

Note that it is also possible to generate data of a full-color image signal by providing circuits 21 receiving red light, circuits 21 receiving green light, and circuits 21 receiving blue light in the circuit 20, generating optical data signals by these circuits 21, and synthesizing the optical data signals. In addition to these circuits 21, circuits 21 receiving light exhibiting one or more of cyan, magenta, and yellow may be provided. By providing the circuits 21 receiving light of one or more of cyan, magenta, and yellow, the number of colors that can be represented in a displayed image based on generated image signals can be increased. For example, by providing a coloring layer, which transmits light of a particular color, in a circuit 21 and letting light enter the circuit 21 through the coloring layer, the optical data signal in accordance with the amount of light of a particular color can be generated. Light detected in the circuit 21 can be visible or invisible.

The circuit 21 may be provided with a cooling unit, which suppresses occurrence of noise due to heat.

The circuit 30 is connected to the circuit 21 via a wiring. Data output from the circuit 21, specifically, an optical data signal or a reset signal generated in the circuit 21, is input to the circuit 30.

The circuit 30 has a function of calculating the difference between a plurality of input signals. Specifically, the circuit 30 has a function of calculating the difference between an optical data signal and a reset signal, and outputting the difference.

Figure 1B:
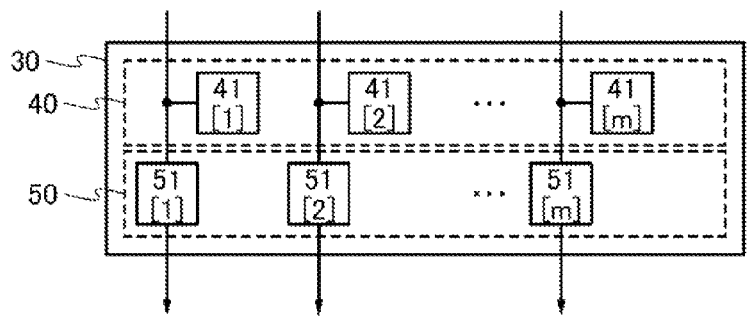

FIG. 1B shows a specific structure example of the circuit 30. The circuit 30 includes a circuit 40 and a circuit 50.

The circuit 40 has a function of controlling signal output from the circuit 20 to the circuit 50. For example, the circuit 40 has a function of supplying a predetermined potential to a wiring connected to the circuits 20 and 50, which enables reset of the potential of the wiring used for output when a signal generated in the circuit 21 is output to the circuit 50, and enables accurate signal output. Here, an example where the circuit 40 includes a plurality of circuit 41 (circuits 41[1] to 41[m]) each of which is placed in a column is shown. The circuit 41 has a function of supplying a predetermined potential to the wiring connected to the circuit 21 and a circuit 51. The circuit 41 can also serve as a constant current source.

The circuit 50 has a function of calculating the difference between an optical data signal and a reset signal input from the circuit 20. Here, an example where the circuit 50 includes a plurality of circuits 51 (circuits 51[1] to 51[m]) each of which is placed in a column is shown. The circuit 51 has a function of calculating the difference between an optical data signal and a reset signal input from the circuit 21, and the difference calculated in the circuit 51 is output to the outside of the circuit 30.

An optical data signal input from the circuit 20 to the circuit 30 includes noise caused by characteristic variation of an element in the circuit 21, wiring resistance, or the like. In one embodiment of the present invention, in addition to an optical data signal, a reset signal is read from the circuit 21, and the difference between the optical data signal and the reset signal is output. The reset signal includes noise similar to that in the optical data signal because the reset signal is also generated in the circuit 21 and output therefrom as in the case of the optical data signal. Thus, by calculating the difference between the optical data signal and the reset signal in the circuit 30, a signal where influence of the noise is lessened can be obtained. Therefore, a semiconductor device with high reliability can be provided.

The circuits 60 and 70 are driving circuits each having a function of selecting a certain circuit 21 among the circuits 21[1,1] to 21[n,m]. Specifically, the circuit 60 has a function of selecting the circuits 21 outputting optical data signals in a certain row. The circuit 70 has a function of selecting the circuits 21 outputting reset signals in a certain row. Output of an optical data signal from the circuit 21 to the circuit 30 is controlled by the circuit 60, and output of a reset signal is controlled by the circuit 60 and the circuit 70. The circuits 60 and 70 are connected to the circuits 21 through wirings.

Although FIG. 1A shows an example where the circuit 60 and the circuit 70 are separately provided, it is possible to provide a driving circuit having both of the functions of the circuit 60 and the circuit 70 in the semiconductor device 10.

Figure 2:
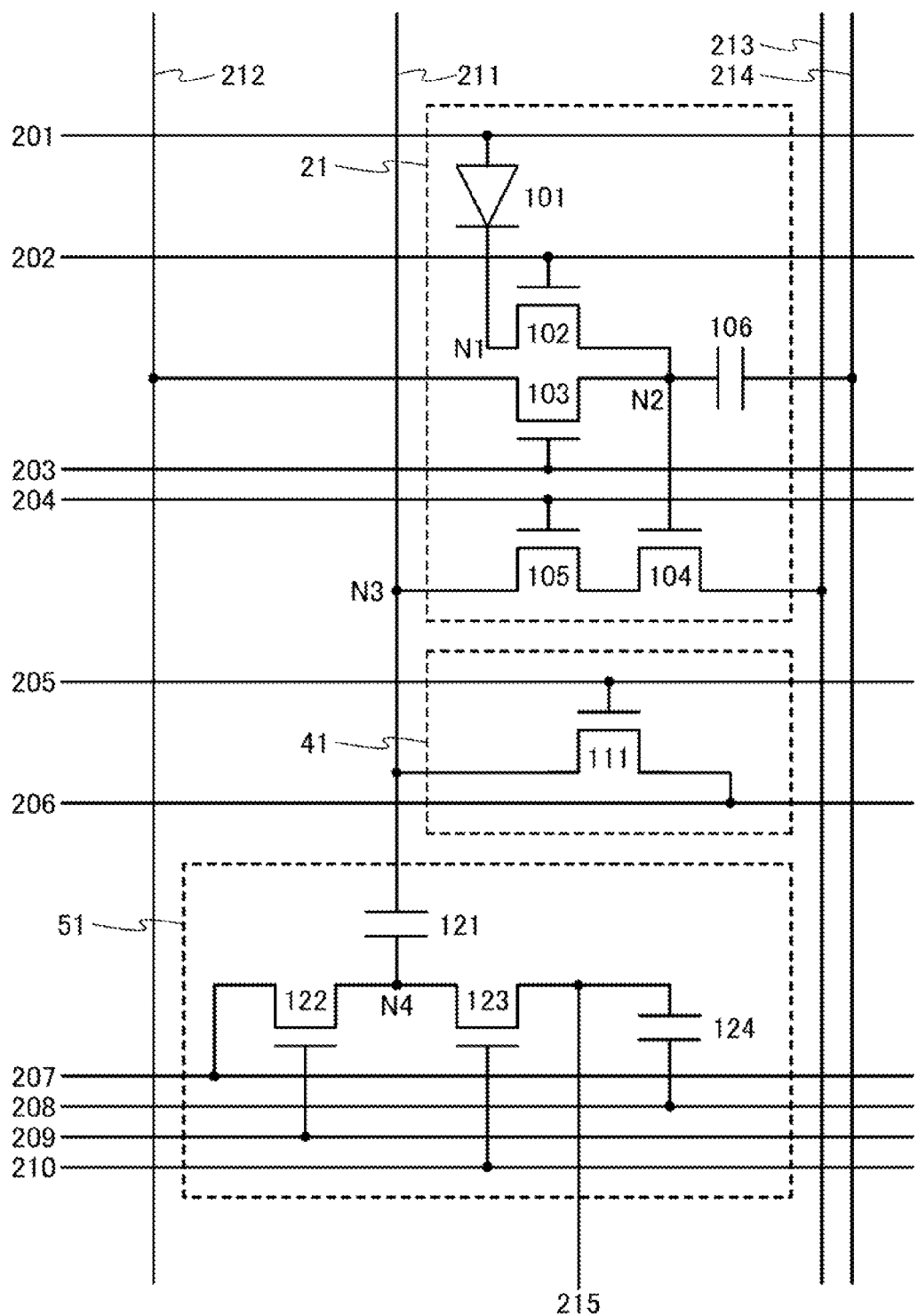
FIG. 2 is a circuit diagram illustrating an example of a structure of a semiconductor device.

Next, a specific circuit structure of the semiconductor device 10 is described. FIG. 2 shows an example of a circuit structure of the circuits 21, 41, and 51. Although an example where all of the transistors are n-channel transistors is shown here, each of transistors 102 to 105, 111, 122, and 123 may be an n-channel transistor or a p-channel transistor.

<Structure Example of Circuit 21>

First, a structure of the circuit 21 is described.

The circuit 21 shown in FIG. 2 includes a photoelectric conversion element 101, transistors 102, 103, 104, and 105, and a capacitor 106. A first terminal of the photoelectric conversion element 101 is connected to a wiring 201, and a second terminal of the photoelectric conversion element 101 is connected to one of a source and a drain of the transistor 102. A gate of the transistor 102 is connected to a wiring 202, and the other of the source and the drain of the transistor 102 is connected to a gate of the transistor 104. A gate of the transistor 103 is connected to a wiring 203, one of a source and a drain of the transistor 103 is connected to the gate of the transistor 104, and the other of the source and the drain of the transistor 103 is connected to a wiring 212. One of a source and a drain of the transistor 104 is connected to a wiring 213, and the other of the source and the drain of the transistor 104 is connected to one of a source and a drain of the transistor 105. A gate of the transistor 105 is connected to a wiring 204, and the other of the source and the drain of the transistor 105 is connected to a wiring 211. One of electrodes of the capacitor 106 is connected to the gate of the transistor 104, and the other of the electrodes of the capacitor 106 is connected to a wiring 214. A node connected to the second terminal of the photoelectric conversion element 101, the one of the source and the drain of the transistor 102 is referred to as a node N1. A node connected to the other of the source and the drain of the transistor 102, the one of the source and the drain of the transistor 103, the gate of the transistor 104, and the one of electrodes of the capacitor 106 is referred to as a node N2. A node connected to the other of the source and the drain of the transistor 105 is referred to as a node N3. If the gate capacitance of the transistor 104 is sufficiently large, the capacitor 106 and the wiring 214 can be omitted.

Note that a source of a transistor in this specification and the like means a source region that is part of a semiconductor functioning as an active layer or a source electrode connected to the semiconductor. Similarly, a drain of a transistor means a drain region that is part of the semiconductor or a drain electrode that is connected to the semiconductor. A "gate" means a gate electrode.

The terms "source" and "drain" of a transistor interchange with each other depending on the conductivity type of the transistor or levels of potentials applied to the terminals. In general, in an n-channel transistor, a terminal to which a lower potential is applied is called a source, and a terminal to which a higher potential is applied is called a drain. Further, in a p-channel transistor, a terminal to which a lower potential is applied is called a drain, and a terminal to which a higher potential is applied is called a source. In this specification, although connection relation of the transistor is described assuming that the source and the drain are fixed in some cases for convenience, actually, the names of the source and the drain interchange with each other depending on the relation of the potentials.

The wirings 201, 212, 213, and 214 are each supplied with a predetermined potential, and each have a function as a power source line. A potential supplied to each of the wirings 201, 212, 213, and 214 may be a high power source potential or a low power source potential (e.g., a ground potential). Among the above wirings, wirings supplied with the same level potentials may be connected to each other, or be the same wiring. For example, the wiring 201 may be connected to the wiring 214, or the wiring 201 and the wiring 214 may be the same wiring. Here, an example where the wirings 201 and 214 are at a low level and the wirings 212 and 213 are at a high level is explained.

The photoelectric conversion element 101 has a function of converting irradiation light into an electrical signal. As the photoelectric conversion element 101, an element with which a photocurrent can be obtained in accordance with the amount of incident light, such as a PN photodiode, a PIN photodiode, or a phototransistor, can be used. In this structure, a photodiode is used as the photoelectric conversion element 101. An anode of the photodiode is connected to the wiring 201, and a cathode of the photodiode is connected to the one of the source and the drain of the transistor 102.

The on/off state of the transistor 102 is controlled by a potential of the wiring 202. If the transistor 102 is on, an electrical signal output from the photoelectric conversion element 101 is supplied to the node N2. Thus, the potential of the node N2 is determined by the amount of irradiation light on the photoelectric conversion element 101. A period when the transistor (02 is on corresponds to the exposure period.

The on/off state of the transistor 103 is controlled by the potential of the wiring 203. If the transistor 103 is turned on, the potential of the node N2 is reset to the same potential as that of the wiring 212. A period when the wiring 203 is supplied with a high potential corresponds to the reset period. Note that the wiring 203 is connected to the circuit 70, and the potential of the wiring 203 is controlled by the circuit 70.

The on/off state of the transistor 104 is controlled by the potential of the node N2. Specifically, the resistance value between the source and the drain of the transistor 104 changes in accordance with the potential of the node N2. Accordingly, a potential to be supplied from the wiring 213 to the node N3 via the transistor 104 is determined by the potential of the node N2.

The on/off state of the transistor 105 is controlled by the potential of the wiring 204. If the transistor 105 is on, a predetermined potential is supplied from the wiring 213 to the node N3 via the transistors 104 and 105. Here, since the resistance value between the source and the drain of the transistor 104 depends on the potential of the node N2, the node N3 has a potential corresponding to the potential of the node N2. Note that the wiring 204 is connected to the circuit 60, and the potential of the wiring 204 is controlled by the circuit 60.

When the transistor 103 is off and the potential of the second terminal of the photoelectric conversion element 101 is supplied to the node N2 via the transistor 102, the node N3 is supplied with a potential corresponding to the amount of irradiation light, i.e., an optical data signal. When the transistor 103 is on and the potential of the wiring 212 is supplied to the node N2 via the transistor 103, the node N3 is supplied with a potential corresponding to the reset state, i.e., a reset signal.

The structure of the circuit 21 is not limited to that shown in FIG. 2. FIGS. 3A to 3D show other structure examples of the circuit 21.

Figure 3A:
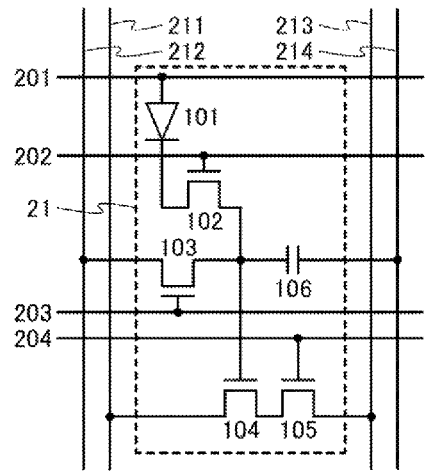
FIGS. 3A to 3D are circuit diagrams each illustrating an example of a structure of a semiconductor device.

The circuit 21 shown in FIG. 3A is different from the structure in FIG. 2 in that the transistor 105 is placed between the transistor 104 and the wiring 213. The gate of the transistor 105 is connected to the wiring 204, the one of the source and the drain of the transistor 105 is connected to the one of the source and the drain of the transistor 104, and the other of the source and the drain of the transistor 105 is connected to the wiring 213. With such a structure, potential change of the gate of the transistor 104 due to potential change of the wiring 213 can be suppressed in a period when the transistor 105 is off, whereby influence of noise can be lessened.

Figure 3B:
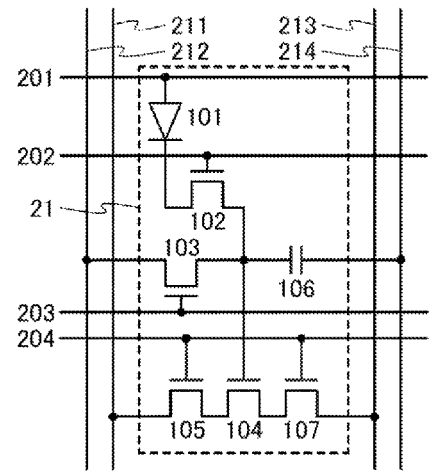

The circuit 21 shown in FIG. 3B is different from the structure in FIG. 2 in that a transistor 107 is placed between the transistor 104 and the wiring 213. A gate of the transistor 107 is connected to the wiring 204, one of a source and a drain of the transistor 107 is connected to the one of the source and the drain of the transistor 104, and the other of the source and the drain of the transistor 107 is connected to the wiring 213. With such a structure, potential change of the gate of the transistor 104 due to potential change of the wirings 211 and 213 can be suppressed in a period when the transistors 105 and 107 are off, whereby influence of noise can be further lessened.

Figure 3C:
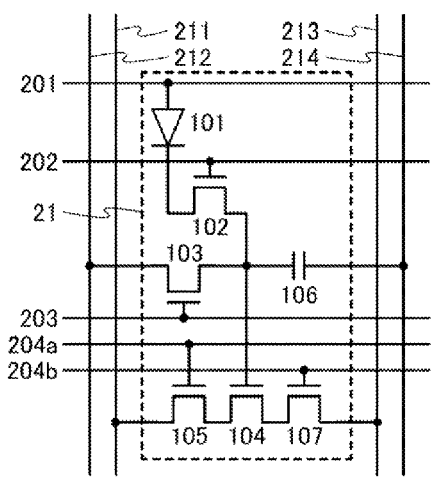

Although the gate of the transistor 105 and the gate of the transistor 107 are connected to the same wiring in FIG. 3B, they may be connected to different wirings. FIG. 3C shows a structure where the gate of the transistor 105 is connected to a wiring 204a while the gate of the transistor 107 is connected to a wiring 204b. With such a structure, the on/off states of the transistor 105 and that of the transistor 107 can be separately controlled.

Figure 3D:
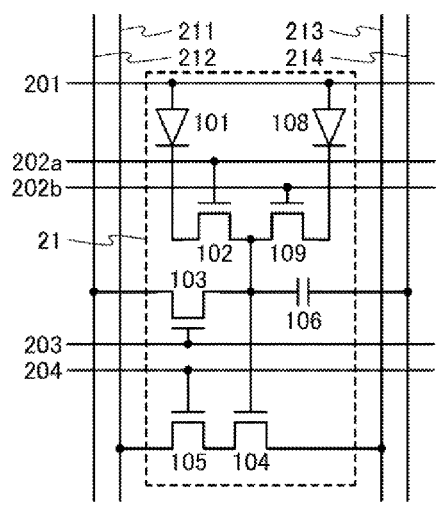

The circuit 21 shown in FIG. 3D is different from the structure in FIG. 2 in that a photoelectric conversion element 108 and a transistor 109 are included. A first terminal of the photoelectric conversion element 108 is connected to the wiring 201, and a second terminal of the photoelectric conversion element 108 is connected to one of a source and a drain of the transistor 109. A gate of the transistor 109 is connected to a wiring 202b, and the other of the source and the drain of the transistor 109 is connected to the gate of the transistor 104. The gate of the transistor 102 is connected to a wiring 202a.

The gate of the transistor 102 and the gate of the transistor 109 are connected to the different wirings, whereby exposure by the photoelectric conversion element 101 and that by the photoelectric conversion element 108 are separately controlled. With such a structure, exposure can be performed with the use of the two photoelectric conversion elements in one pixel. Note that there is no particular limitation on the number of the photoelectric conversion elements provided in the circuit 21, and three or more photoelectric conversion elements may be provided. In addition, in the circuit 21 in FIG. 3D, the configurations in FIG. 3A to 3C can be incorporated.

In this way, an optical data signal and a reset signal can be output to the node N3 in the circuit 21. Then, the optical data signal and the reset signal output to the node N3 is supplied to the circuit 51.

<Structure Example of Circuit 41>

Next, a structure of the circuit 41 is described.

The circuit 41 shown in FIG. 2 includes a transistor 111. A gate of the transistor 111 is connected to a wiring 205, one of a source and a drain thereof is connected to a wiring 206, and the other of the source and the drain thereof is connected to the wiring 211.

The on/off state of the transistor 111 is controlled by the potential of the wiring 205. If the transistor 111 is turned on, the potential of the wiring 206 is supplied to the wiring 211. Here, as an example, the potential of the wiring 213 and that of the wiring 206 are set high and a low level, respectively. First, the transistor 111 is turned on, and then turned off, whereby the potential of the node N3 is reset to the potential of the wiring 206. After that, the transistor 105 is turned on, whereby a potential corresponding to the potential of the node N2 is output to the node N3. Here, because the transistor 104 is a source follower, a potential lowered from the potential of the node N2 by the threshold voltage of the transistor 104 is output to the node N3.

When a constant potential is continuously supplied to the wiring 205, the transistor 111 can serve as a power source. To the node N3 output is a potential obtained by resistance division of combined resistance of the resistance between the source and the drain of the transistor 111 and the resistance between the source and the drain of the transistor 105.

<Structure Example of Circuit 51>

Next, a structure of the circuit 51 is described.

The circuit 51 shown in FIG. 2 includes a capacitor 121, a transistor 122, a transistor 123, and a capacitor 124. One of electrodes of the capacitor 121 is connected to the wiring 211, and the other of the electrodes of the capacitor 121 is connected to one of a source and a drain of the transistor 122 and one of a source and a drain of the transistor 123. A gate of the transistor 122 is connected to a wiring 209, and the other of the source and the drain of the transistor 122 is connected to a wiring 207. A gate of the transistor 123 is connected to a wiring 210, and the other of the source and the drain of the transistor 123 is connected to one of electrodes of the capacitor 124. The other of the electrodes of the capacitor 124 is connected to a wiring 208. Note that a node connected to the other of the electrodes of the capacitor 121, the one of the source and the drain of the transistor 122, and the one of the source and the drain of the transistor 123 is referred to as a node N4. The other of the source and the drain of the transistor 123 and the one of electrodes of the capacitor 124 is connected to a wiring 215.

The wiring 215 is a wiring for supplying the difference calculated in the circuit 51 to the outside.

The on/off state of the transistor 122 is controlled by the potential of the wiring 209. If the transistor 122 is turned on, the potential of the wiring 207 is supplied to the node N4. The on/off state of the transistor 123 is controlled by the potential of the wiring 210. If the transistor 123 is turned on, the potential of the node N4 is supplied to the wiring 215. Note that the wiring 215 is connected to another circuit. The capacitor 124 has a function of retaining the potential of the wiring 215.

When an optical data signal is output to the node N3, the transistors 122 and 123 are on. Accordingly, the potential of the node N4 and that of the wiring 215 are the same as the potential of the wiring 207.

After that, the transistor 122 is turned off. Then, the transistor 103 is turned on to reset the potential of the node N2 to the same potential as that of the wiring 212, so that a reset signal is output to the node N3. At this time, because the node N4 is in a floating state, the potential of the node N4 changes in accordance with potential change of the node N3. Specifically, the potential of the node N4 is changed through the capacitor 121 by the difference between the potential of the optical data signal that has been output to the node N3 in advance and the potential of the reset signal that is output to the node N3 later. Then, a potential that has changed by the difference is output to the external circuit via the wiring 215. In this way, the circuit 51 can calculate the potential difference between the optical data signal and the reset signal, and can output a signal where influence of noise is lessened. That is, the circuit 51 can be used as a CDS circuit.

Although there is no particular limitation on materials and the like used for the transistors shown in FIG. 2 and FIGS. 3A to 3D (the transistors 102 to 105, 107, 109, 111, 122, and 123), it is particularly preferable to use a transistor in which an oxide semiconductor is used in a channel formation region (hereinafter also referred to as an OS transistor) for these transistors.

An oxide semiconductor has a wider band gap and lower intrinsic carrier density than other semiconductors such as silicon. Thus, the off-state current of the OS transistor is extremely low. For this reason, a semiconductor device including the OS transistor can retain certain data for a long time. In addition, the semiconductor device requires less power consumption.

For example, when the transistor 102 is an OS transistor, potential change of the node N2 due to charge transfer between the node N2 and the node N1 can be suppressed in a period when the transistor 102 is off. Therefore, charge stored in the node N2 can be retained for an extremely long time.

When the transistor 103 is an OS transistor, potential change of the node N2 due to charge transfer between the node N2 and the wiring 212 can be suppressed in a period when the transistor 103 is off. Therefore, charge stored in the node N2 can be retained for an extremely long time.

When the transistor 122 is an OS transistor, potential change of the node N4 due to charge transfer between the node N4 and the wiring 207 can be suppressed in a period when the transistor 122 is off. Therefore, charge stored in the node N4 can be retained for an extremely long time.

When the transistor 123 is an OS transistor, noise of the wiring 215 can be effectively lessened in a period when the transistor 123 is off.

When all transistors are OS transistors, those in the circuits 21, 41, and 51 can be manufactured through the same steps, whereby the number of manufacturing steps can be reduced.

In the case where the transistors 102 and 103 are OS transistors with extremely low off-state current, the potential of the node N2 can be retained and an optical data signal can be accurately output even when the potential of the node N2 is extremely low. Thus, it is possible to broaden the detection range of light illuminance, i.e., the dynamic range, of the circuit 21.

When the semiconductor device 10 is driven by a global shutter system that performs exposure in circuits 21 in several rows (circuits 21 in all the rows at a maximum) at a time and then performs row-by-row reading sequentially, a distortion-free image can be obtained. However, in a global shutter system, time from exposure to reading, i.e., a period when charge is retained in the node N2, varies depending on the row where the circuits 21 are provided. Therefore, potential change of the node N2 caused by time passage is preferably small when a global shutter system is employed. Here, if an OS transistor is used in the circuit 21, charge stored in the node N2 can be retained for an extremely long time; therefore, an optical data signal can be accurately read even when a global shutter system is employed.

Furthermore, the circuit 50 reads a reset signal after reading an optical data signal, thereby calculating the difference. Therefore, even when exposure is performed in the circuits 21 in several rows at a time and then row-by-row reading is sequentially performed, the difference between optical data signals and reset signals can be calculated row by row.

Note that the transistors in FIG. 2 and FIGS. 3A to 3D are not limited to OS transistors. For example, they can be transistors each of whose channel formation region is formed in part of a substrate including a single crystal semiconductor. As the substrate including a single crystal semiconductor, a single crystal silicon substrate, a single crystal germanium substrate, or the like can be used. Since a transistor including a single crystal semiconductor in the channel formation region has a high current supply capability, the operation speed of the semiconductor device 10 can be increased by inclusion of such a transistor in the circuits 21, 41, and 51.

Furthermore, the transistors in FIG. 2 and FIGS. 3A to 3D can be transistors each of whose channel formation region is formed in a semiconductor film. For example, the transistor can be a transistor whose channel formation region includes a non-single-crystal semiconductor. As the non-single-crystal semiconductor, non-single-crystal silicon such as amorphous silicon, microcrystalline silicon or polycrystalline silicon, non-single-crystal germanium such as amorphous germanium, microcrystalline germanium or polycrystalline germanium, or the like can be used.

Unless otherwise specified, the off-state current in this specification refers to a drain current of a transistor in the off state (also referred to as non-conduction state and cutoff state). Unless otherwise specified, the off state of an n-channel transistor means that a voltage (Vgs) between its gate and source is lower than the threshold voltage (Vth), and the off state of a p-channel transistor means that the gate-source voltage Vgs is higher than the threshold voltage Vth. For example, the off-state current of an n-channel transistor sometimes refers to a drain current that flows when the gate-source voltage Vgs is lower than the threshold voltage Vth.

The off-state current of a transistor depends on Vgs in some cases. Thus, "the off-state current of a transistor is lower than or equal to I" may mean "there is Vgs with which the off-state current of the transistor becomes lower than or equal to I". Furthermore, "the off-state current of a transistor" means "the off-state current in an off state at predetermined Vgs", "the off-state current in an off state at Vgs in a predetermined range", "the off-state current in an off state at Vgs with which sufficiently reduced off-state current is obtained", or the like.

As an example, the assumption is made of an n-channel transistor where the threshold voltage Vth is 0.5 V and the drain current is $1 \times 10^{-9}$ A at Vgs of 0.5 V, $1 \times 10^{-13}$ A at Vgs of 0.1 V, $1 \times 10^{-19}$ A at Vgs of −0.5 V and $1 \times 10^{-22}$ A at Vgs of −0.8 V. The drain current of the transistor is $1 \times 10^{-19}$ A or lower at Vgs of −0.5 V or at Vgs in the range of −0.8 V to −0.5 V; therefore, it can be said that the off-state current of the transistor is $1 \times 10^{-19}$ A or lower. Since there is Vgs at which the drain current of the transistor is $1 \times 10^{-22}$ A or lower, it may be said that the off-state current of the transistor is $1 \times 10^{-22}$ A or lower.

In this specification, the off-state current of a transistor with a channel width W is sometimes represented by a current value per the channel width W or by a current value per given channel width (e.g., 1 μm). In the latter case, the off-state current may be expressed in the unit with the dimension of current per length (e.g., A/μm).

The off-state current of a transistor depends on temperature in some cases. Unless otherwise specified, the off-state current in this specification may be an off-state current at room temperature, 60° C., 85° C., 95° C., or 125° C. Alternatively, the off-state current may be an off-state current at a temperature at which the reliability required in a semiconductor device or the like including the transistor is ensured or a temperature at which the semiconductor device or the like including the transistor is used (e.g., temperature in the range of 5° C. to 35° C.). The description "an off-state current of a transistor is lower than or equal to I" may refer to a situation where there is Vgs at which the off-state current of a transistor is lower than or equal to 1 at room temperature, 60° C., 85° C., 95° C., 125° C., a temperature at which the reliability required in a semiconductor device or the like including the transistor is ensured, or a temperature at which the semiconductor device or the like including the transistor is used (e.g., temperature in the range of 5° C. to 35° C.).

The off-state current of a transistor depends on voltage Vds between its drain and source in some cases. Unless otherwise specified, the off-state current in this specification may be an off-state current at Vds of 0.1 V, 0.8 V, 1 V, 1.2 V, 1.8 V, 2.5 V, 3 V 3.3 V, 10 V, 12 V, 16 V, or 20 V. Alternatively, the off-state current might be an off-state current at Vds at which the required reliability of a semiconductor device or the like including the transistor is ensured or Vds at which the semiconductor device or the like including the transistor is used. The description "an off-state current of a transistor is lower than or equal to I" may refer to a situation where there is Vgs at which the off-state current of a transistor is lower than or equal to I at Vds of 0.1 V, 0.8 V, 1 V, 1.2 V, 1.8 V, 2.5 V, 3 V, 3.3 V, 10 V, 12 V, 16 V, or 20 V, Vds at which the required reliability of a semiconductor device or the like including the transistor is ensured, or Vds at which in the semiconductor device or the like including the transistor is used.

In the above description of off-state current, a drain may be replaced with a source. That is, the off-state current sometimes refers to a current that flows through a source of a transistor in the off state.

In this specification, the term "leakage current" sometimes expresses the same meaning as off-state current.

In this specification, the off-state current sometimes refers to a current that flows between a source and a drain when a transistor is off, for example.

Next, examples of specific structures of the circuits 60 and 70 are described.

<Structure Example of Circuit 60>

First, a structure example of the circuit 60 is described.

Figure 4:
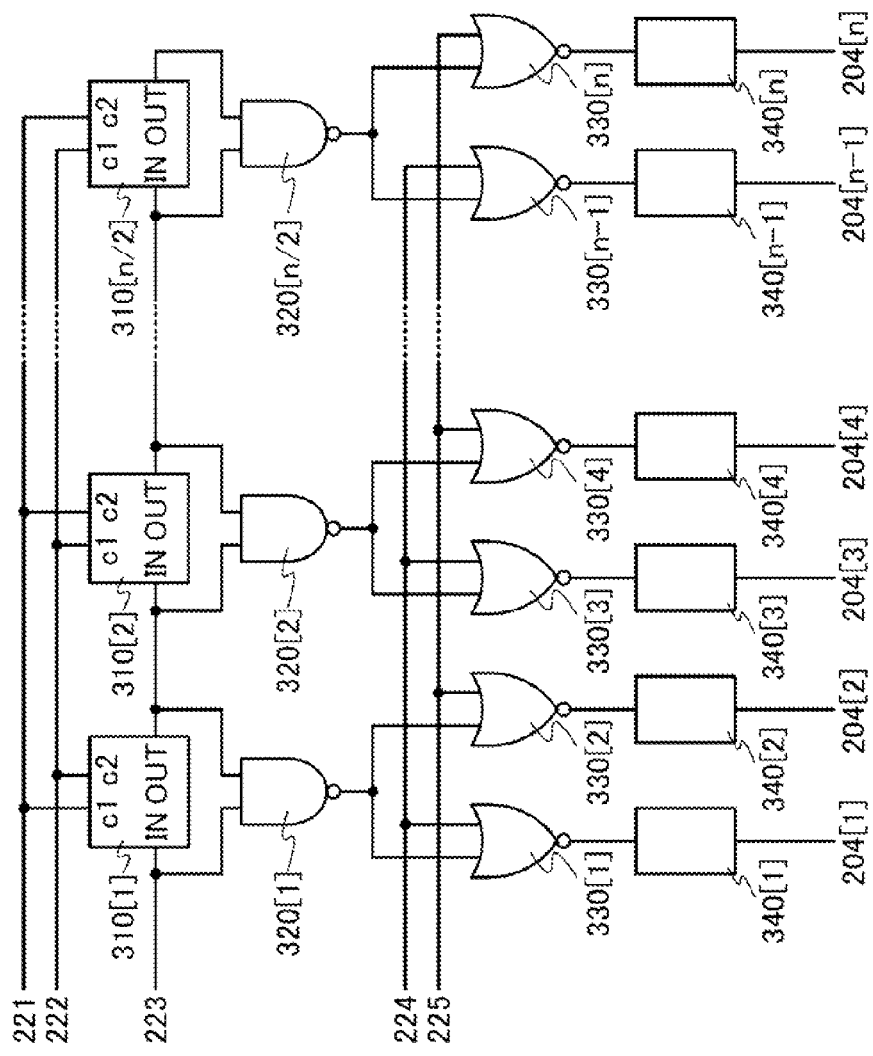
FIG. 4 is a circuit diagram illustrating an example of a structure of a semiconductor device.

As shown in FIG. 4, the circuit 60 includes a plurality of shift registers 310 (shift registers 310[1] to 310[n/2]), a plurality of NANDs 320 (NANDs 320[1] to 320[n/2]), a plurality of NORs 330 (NORs 330[1] to 330[n]), and a plurality of buffer circuits 340 (buffer circuits 340[1] to 340[n]).

A terminal c1, a terminal c2, a terminal IN, a terminal OUT of the shift register 310[1] are connected to a wiring 221, a wiring 222, a wiring 223, and a terminal IN of a shift register in the next row (shift register 310[2]), respectively.

In addition, each of the terminals IN of the shift registers 310[2] to 310[n/2−1] is connected to the terminal OUT of the shift register 310 in the previous row, and each of the terminals OUT of the shift registers 310[2] to 310[n/2−1] is connected to the terminal IN of the shift register 310 in the next row. That is, the terminal IN and the terminal OUT of the shift register 310[1] (i is an integer number that satisfies 1≤i≤n/2) except the shift registers 310[1] and 310[n/2] are connected to the terminal OUT of the shift register 310[i−1] and the terminal IN of the shift register 310[i+1], respectively.

The terminal IN of the shift register 310[n/2] is connected to the terminal OUT of the shift register in the previous row (shift register 310[n/2−1], and the terminal OUT of the shift register 310[n/2] is connected to the NAND 320[n/2].

The terminals c1 of the shift registers 310 in odd-numbered rows are connected to the wiring 221, and the terminals c2 thereof are connected to the wiring 222. The terminals c1 of the shift registers 310 in even-numbered rows are connected to the wiring 222, and the terminals c2 thereof are connected to the wiring 221.

The shift registers 310[1] to 310[n/2] have a function of transferring a start pulse SP1 supplied to the wiring 223 to the next row in synchronization with a clock signal CK1 supplied to the wiring 222 and an inverted clock signal CKB1 supplied to the wiring 221. Each of the shift registers 310[1] to 310[n/2] outputs a signal to be supplied to the wirings 204 in two rows. A signal supplied to each of the wirings 204 is controlled by potentials of a wiring 224 and a wiring 225. Thus, the number of the shift registers 310 is one-half of the number of the wirings 204. Note that the potential of the wiring 224 controls signal supply to the wirings 204 in odd-numbered rows while the potential of the wiring 225 controls signal supply to the wirings 204 in even-numbered rows.

A first input terminal and a second input terminal of each of the NANDs 320[1] to 320[n/2] are connected to the terminal IN and the terminal OUT of the shift register 310 in the same row, respectively. That is, the first input terminal of the NAND 320[i] is connected to the terminal IN of the shift register 310[i], and the second input terminal of the NAND 320[i] is connected to the terminal OUT of the shift register 310[i]. Each of the NANDs 320[1] to 320[n/2]

outputs a low level potential if potentials of the terminal IN and the terminal OUT of the shift register 310 in the same row are both high.

A first input terminal and a second input terminal of each of the NORs 330[1] to 330[n] are connected to an output terminal of the NAND 320 and the wiring 224 or 225, respectively. Specifically, the first input terminals of the NOR 330[j] (j is an odd number that satisfies 1≤j≤n) and the NOR 330[j+1] are connected to the output terminal of the NAND 320[(j+1)/2]. Note that the second input terminals of the NORs 330 in the odd-numbered rows are connected to the wiring 224, and the second input terminals of the NORs 330 in the even-numbered rows are connected to the wiring 225. Each of the NORs 330[1] to 330[n] outputs a high potential to the buffer circuit 340 in the same row if potentials input to the first input terminal and the second input terminal are both low.

An input terminal and an output terminal of each of the buffer circuits 340[1] to 340[n] are connected to the output terminal of the NOR 330 in the same row and the wiring 204 in the same row, respectively. That is, the input terminal of the buffer circuit 340[j] is connected to the output terminal of the NOR 330[j], and the output terminal of the buffer circuit 340[1] is connected to the wiring 204[j]. The input terminal of the buffer circuit 340[j+1] is connected to the output terminal of the NOR 330[j+1], and the output terminal of the buffer circuit 340[j+1] is connected to the wiring 204[j+1]. The buffer circuits 340[1] to 340[n] each have a function of amplifying output of the NOR 330 and supplying the amplified output to the wiring 204.

In this way, potentials of the wirings 204[1] to 204[n] are controlled by the circuit 60, and the on/off state of the transistors 105 (see FIG. 2) is controlled.

<Structure Example of Circuit 70>

Next, a structure example of the circuit 70 is described.

Figure 5:
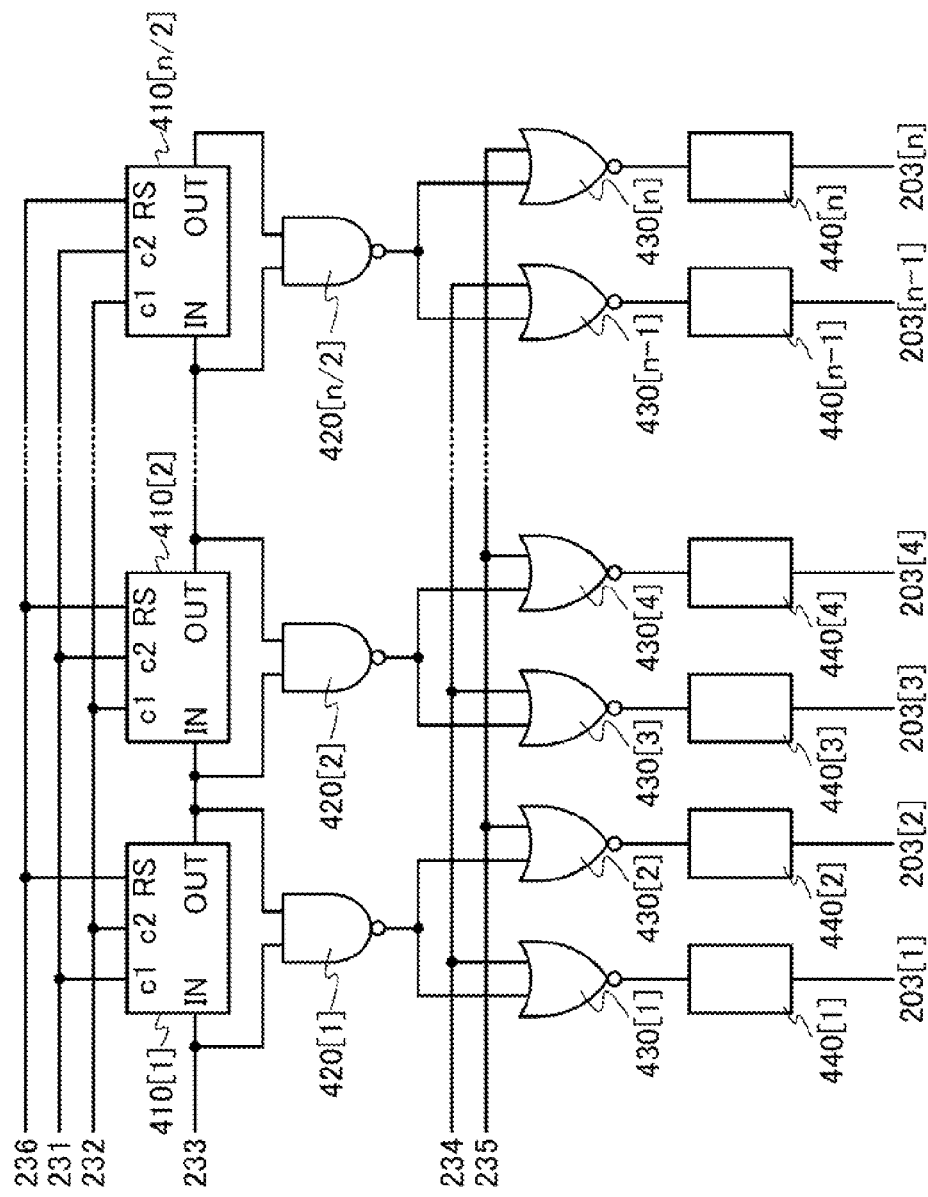
FIG. 5 is a circuit diagram illustrating an example of a structure of a semiconductor device.

As shown in FIG. 5, the circuit 70 includes a plurality of shift registers 410 (shift registers 410[1] to 410[n/2]), a plurality of NANDs 420 (NANDs 420[1] to 420[n/2]), a plurality of NORs 430 (NORs 430[1] to 430[n]), and a plurality of buffer circuits 440 (buffer circuits 440(1 to 440[n]).

A terminal c1, a terminal c2, a terminal IN, a terminal OUT of the shift register 410[1] are connected to a wiring 231, a wiring 232, a wiring 233, and a terminal IN of a shift register in the next row (shift register 410[2]), respectively.

In addition, each of the terminals IN of the shift registers 410[2] to 410[n/2−1] is connected to the terminal OUT of the shift register 410 in the previous row, and each of the terminals OUT of the shift registers 410[2] to 410[n/2−1] is connected to the terminal IN of the shift register 410 in the next row. That is, the terminal IN and the terminal OUT of the shift register 410[i] except the shift registers 410[1] and 410[n/2] are connected to the terminal OUT of the shift register 410[i−1] and the terminal IN of the shift register 410[i+1], respectively.

The terminal IN of the shift register 410[n/2] is connected to the terminal OUT of the shift register in the previous row (shift register 410[n/2−1]), and the terminal OUT of the shift register 410[n/2] is connected to the NAND 420[n/2].

The terminals c1 of the shift registers 410 in odd-numbered rows are connected to the wiring 231, and the terminals c2 thereof are connected to the wiring 232. The terminals c1 of the shift registers 410 in even-numbered rows are connected to the wiring 232, and the terminals c2 thereof are connected to the wiring 231.

The shift registers 410[1] to 410[n/2] have a function of transferring a start pulse SP2 supplied to the wiring 233 to the next row in synchronization with a clock signal CK2 supplied to the wiring 232 and an inverted clock signal CKB2 supplied to the wiring 231. Each of the shift registers 410[1] to 410[n/2] outputs a signal to be supplied to the wirings 203 in two rows. A signal supplied to each of the wirings 203 is controlled by potentials of a wiring 234 and a wiring 235. Thus, the number of the shift registers 410 is one-half of the number of the wirings 203. Note that the potential of the wiring 234 controls signal supply to the wirings 203 in odd-numbered rows while the potential of the wiring 235 controls signal supply to the wirings 203 in even-numbered rows.

Terminals RS of the shift registers 410[1] to 410[n/2] are connected to a wiring 236. If the potential of the wiring 236 is set high, output from the shift registers 410[1] to 410[n/2] is forcibly set low.

A first input terminal and a second input terminal of each of the NANDs 420[1] to 420[n/2] are connected to the terminal IN and the terminal OUT of the shift register 410 in the same row, respectively. That is, the first input terminal of the NAND 420[1] is connected to the terminal IN of the shift register 410[i], and the second input terminal of the NAND 420[i] is connected to the terminal OUT of the shift register 410[i]. Each of the NANDs 420[1] to 420[n/2] outputs a low level potential if potentials of the terminal IN and the terminal OUT of the shift register 410 in the same row are both high.

A first input terminal and a second input terminal of each of the NORs 430[1] to 430[n] are connected to an output terminal of the NAND 420 and the wiring 234 or 235, respectively. Specifically, the first input terminals of the NOR 430[j] and the NOR 430[j+1] are connected to the output terminal of a NAND 420[(j+1)/2]. Note that the second input terminals of the NORs 430 in the odd-numbered rows are connected to the wiring 234, and the second input terminals of the NORs 430 in the even-numbered rows are connected to the wiring 235. Each of the NORs 430[j] to 430[n] outputs a high potential to the buffer circuit 440 in the same row if potentials input to the first input terminal and the input second terminal are both low.

An input terminal and an output terminal of each of the buffer circuits 440[1] to 440[n] are connected to the output terminal of the NOR 430 in the same row and the wiring 203 in the same row, respectively. That is, the input terminal of the buffer circuit 440[j] is connected to the output terminal of the NOR 430[j], and the output terminal of the buffer circuit 440[j] is connected to the wiring 203[j]. The input terminal of the buffer circuit 440[j+1] is connected to the output terminal of the NOR 430[j+1], and the output terminal of the buffer circuit 440[j+1] is connected to the wiring 203[j+1]. The buffer circuits 440[1] to 440[n] each have a function of amplifying output of the NOR 430 and supplying the amplified output to the wiring 203.

In this way, potentials of the wirings 203[1] to 203[n] are controlled by the circuit 70, and the on/off state of the transistors 103 (see FIG. 2) is controlled.

<Structure Example of Shift Register 310>

Next, a structure example of the shift register 310 included in the circuit 60 is described.

Figure 6:
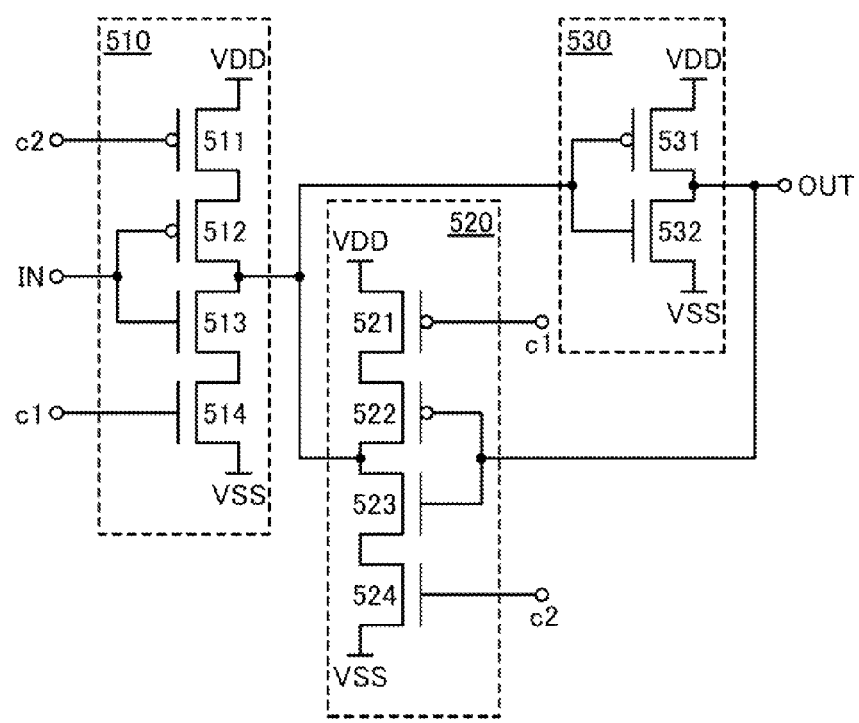
FIG. 6 is a circuit diagram illustrating an example of a structure of a semiconductor device.

As shown in FIG. 6, the shift register 310 includes a clocked inverter 510, a clocked inverter 520, and an inverter 530.

The clocked inverter 510 includes transistors 511 to 514. A gate of the transistor 511 is connected to the terminal c2. One of a source and a drain of the transistor 511 is connected to a high-voltage power source line VDD. The other of the source and the drain of the transistor 511 is connected to one of a source and a drain of the transistor 512. A gate of the transistor 512 is connected to the terminal IN. The other of the source and the drain of the transistor 512 is connected to one of a source and a drain of the transistor 513. A gate of the transistor 513 is connected to the terminal IN. The other of the source and the drain of the transistor 513 is connected to one of a source and a drain of the transistor 514. A gate of the transistor 514 is connected to the terminal c1. The other of the source and the drain of the transistor 514 is connected to a low-voltage power source line VSS. Note that the terminal c1 is connected to one of the wiring 221 and the wiring 222, and the terminal c2 is connected to the other of the wiring 221 and the wiring 222. The wiring 222 is supplied with a clock signal CK1, and the wiring 221 is supplied with an inverted clock signal CKB1.

The clocked inverter 520 includes transistors 521 to 524. A gate of the transistor 521 is connected to the terminal c1. One of a source and a drain of the transistor 521 is connected to the high-voltage power source line VDD. The other of the source and the drain of the transistor 521 is connected to one of a source and a drain of the transistor 522. A gate of the transistor 522 is connected to the terminal OUT. The other of the source and the drain of the transistor 522 is connected to one of a source and a drain of the transistor 523. A gate of the transistor 523 is connected to the terminal OUT. The other of the source and the drain of the transistor 523 is connected to one of a source and a drain of the transistor 524. A gate of the transistor 524 is connected to the terminal c2. The other of the source and the drain of the transistor 524 is connected to the low-voltage power source line VSS. Here, the other of the source and the drain of the transistor 522 and the one of the source and the drain of the transistor 523 are connected to the other of the source and the drain of the transistor 512 and the one of the source and the drain of the transistor 513.

The inverter 530 includes transistors 531 and 532. A gate of the transistor 531 is connected to the other of the source and the drain of the transistor 512 and the one of the source and the drain of the transistor 513. One of a source and a drain of the transistor 531 is connected to the high-voltage power source line VDD, and the other of the source and the drain of the transistor 531 is connected to one of a source and a drain of the transistor 532. A gate of the transistor 532 is connected to the other of the source and the drain of the transistor 512 and the one of the source and the drain of the transistor 513. The other of the source and the drain of the transistor 532 is connected to the low-voltage power source line VSS. Here, the other of the source and the drain of the transistor 531 and the one of the source and the drain of the transistor 532 are connected to the terminal OUT.

The clocked inverters 510 and 520 each have a function of outputting the potential of the input terminal thereof in synchronization with a clock signal CK1 and an inverted clock signal CKB1. Therefore, a signal input to the terminal IN is transferred to the clocked inverter 510 and the inverter 530 in synchronization with a clock signal CK1 and an inverted clock signal CKB1. Then, a positive logic of the potential of the terminal IN is output to the terminal OUT. Note that the clocked inverter 520 and the inverter 530 have a function as a flip-flop and a function of retaining data of the shift register 310.

Note that there is no particular limitation on materials of the transistors included in the shift register 310. For example, an OS transistor, a transistor including a single crystal semiconductor in a channel formation region, a transistor whose channel formation region is formed in a semiconductor film, or the like, can be used.

<Structure Example of Shift Register 410>

Next, a structure example of the shift register 410 included in the circuit 70 is described.

Figure 7:
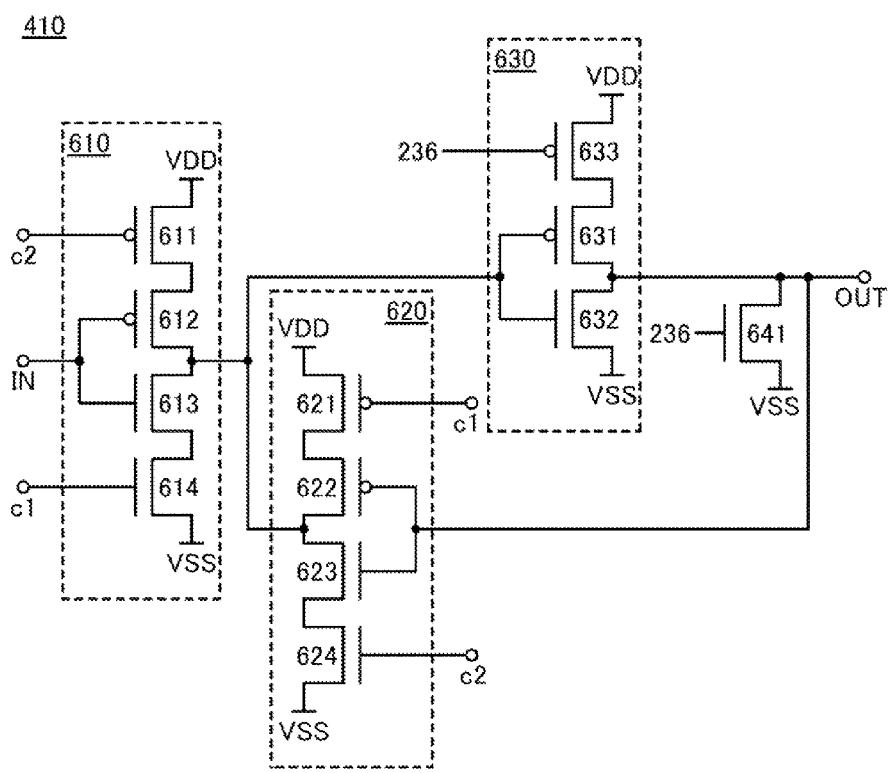
FIG. 7 is a circuit diagram illustrating an example of a structure of a semiconductor device.

As shown in FIG. 7, the shift register 410 includes a clocked inverter 610, a clocked inverter 620, an inverter 630, and a transistor 641. The shift register 410 is different from the shift register 310 shown in FIG. 6 in that a transistor 633 and the transistor 641 are included. The other structures and connection relationships are the same as those of the shift register 310, so that the detailed description is omitted.

A gate of the transistor 633 is connected to the wiring 236, one of a source and a drain of the transistor 633 is connected to the high-voltage power source line VDD, and the other of the source and the drain of the transistor 633 is connected to one of a source and a drain of a transistor 631. A gate of the transistor 641 is connected to the wiring 236, one of a source and a drain of the transistor 641 is connected to the low-voltage power source line VSS, and the other of the source and the drain of the transistor 641 is connected to the terminal OUT.

When a potential of the wiring 236 becomes high, the transistor 641 is turned on, and thus output of the shift register 410 is forcibly set low. Note that if output of the inverter 630 becomes high in a period when the transistor 641 is on, shoot-through current may flow between the inverter 630 and the transistor 641. However, occurrence of shoot-through current can be prevented because the transistor 633 included in the inverter 630 is off when the potential of the wiring 236 is high.

Note that there is no particular limitation on materials of the transistors included in the shift register 410. For example, an OS transistor, a transistor including a single crystal semiconductor in a channel formation region, a transistor whose channel formation region is formed in a semiconductor film, or the like, can be used.

<Operation>

Next, an operation example of the semiconductor device 10 is described.

Figure 8:
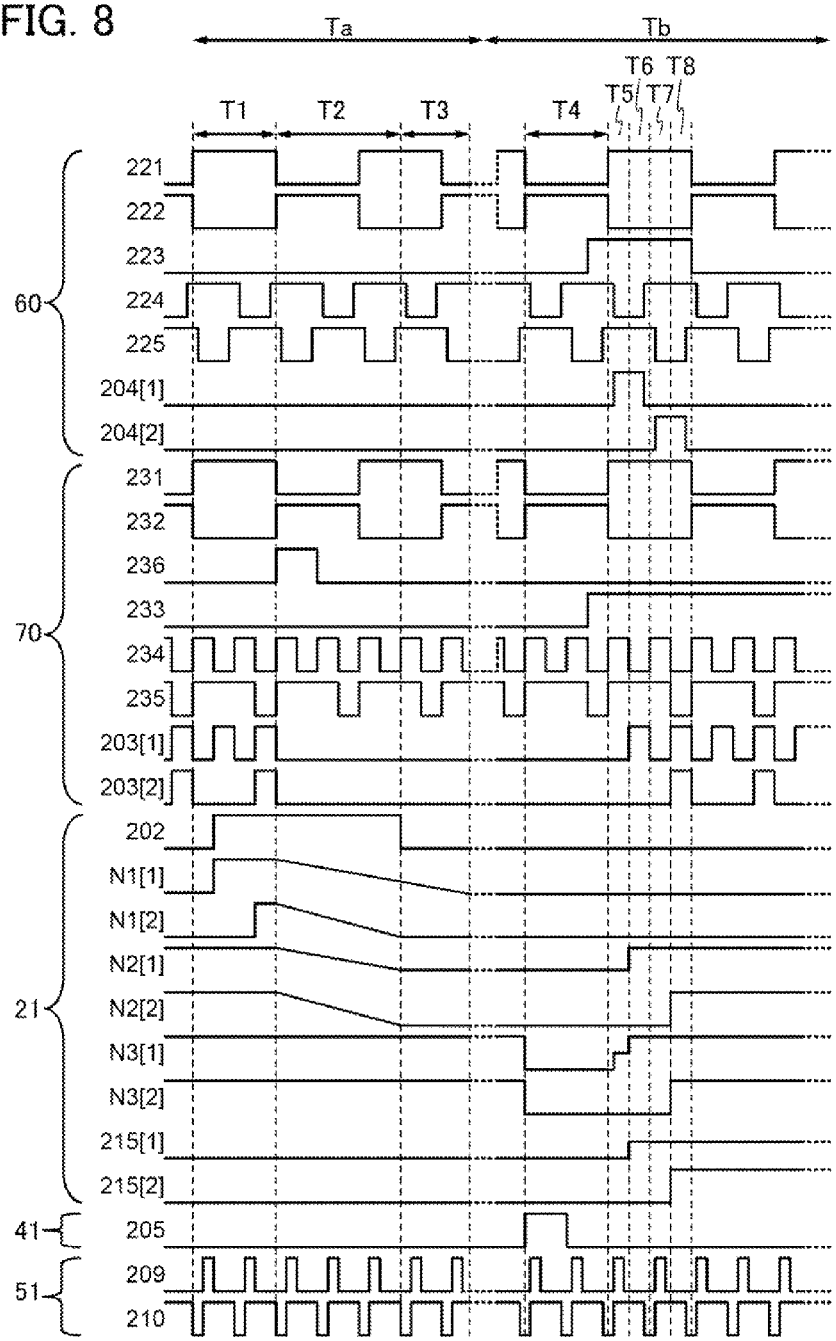
FIG. 8 is a timing chart.

FIG. 8 shows a timing chart of the circuit 60 (see FIG. 4), the circuit 70 (see FIG. 5), and the circuits 21, 41, and 51 (see FIG. 2).

Here, a reset operation immediately before exposure is referred to as a first reset, and a reset operation for generating and reading a reset signal to calculate the difference is referred to as a second reset. In FIG. 8, a period Ta is a period when the first reset and exposure in the circuit 21 are performed, and a period Tb is a period when an optical data signal and a reset signal are read. In addition, the nodes N1, N2, and N3 in the circuit 21[1,1] are referred to as N1[1], N2[1], and N3[1], while the nodes N1, N2, and N3 in the circuit 21[2,1] are referred to as N1[2], N2[2], and N3[2].

Although operations of the circuits 21[1,1] and 21[2,1] are especially described in this example, the circuits 21[1,2] to 21[1,m] can operate similarly to the circuit 21[1,1], and the circuits 21[2,2] to 21[2,m] can operate similarly to the circuit 21[2,1].

First, the first reset and the exposure in periods T1 to T3 are described.

First, in the period T1, the potential of the wiring 203[1] is set high, so that the transistor 103 in the circuit 21[1,1] is turned on. In addition, the potential of the wiring 203[2] is set high, so that the transistor 103 in the circuit 21[2,1] is turned on. Furthermore, the potential of the wiring 202 is high when the potentials of the wirings 203[1] and 203[2] are at high level, whereby the transistors 102 in the circuit 21[1,1] and 21[2,1] are turned on, and the potentials of the node N1[1] and the node N1[2] are reset to the same level potential as the potential of the wiring 212 (here, a high level).

If the potentials of the nodes N1[1] and N1[2] are low in a period immediately before the period T1, the potentials of the nodes N2[1] and N2[2] may be rapidly lowered immediately after the transistors 102 are turned on. However, if the potential of the wiring 203 is set high and the transistor 103 is turned on before the transistor 102 is turned on in the period T1, the potentials of the nodes N1 and node N2 are reset to be high to prevent rapid lowering of the potentials. In addition, the capacitor 106 with larger capacitance than parasitic capacitance of the node N1 is effective to suppress the rapid lowering of the potential of the node N2.

Next, the potential of the wiring 236 is set high in the period T2, whereby the operation of the circuit 70 is forcibly terminated and the potentials of the wiring 203[1] and the wiring 203[2] become low. Therefore, the transistors 103 are turned off, and the potentials of the nodes N2[1] and N2[2] are lowered in accordance with the amount of irradiation light on the photoelectric conversion elements 101. Thus, the exposure can be performed in the circuits 21. Here, an example where a decrease in the potential of the node N2[2] is larger than that of the node N2[1] is shown.

Next, in the period T3, the potential of the wiring 202 is set low and the transistor 102 is turned off, whereby the potentials of the nodes N2[1] and N2[2] are retained. That is, the exposure period is terminated.

Through the above operations, the first reset and the exposure are performed in the circuits 21.

Next, reading of an optical data signal and a reset signal in periods T4 to T8 is described.

In the period T4, the potential of the wiring 205 is set high and thus the transistor 111 is turned on, whereby the potentials of the nodes N3[1] and N3[2] become at the same level as that of the wiring 206 (here, a low level). Note that the potential of the wiring 206 is low, and the potential of the wiring 213 is high here.

The potential of the wiring 223 is set high, whereby the shift register 310 in the circuit 60 starts to operate. In addition, the potential of the wiring 233 is set high, whereby the shift register 410 in the circuit 70 starts to operate.

Next, in the period T5, the potential of the wiring 224 is set low and thus the potential of the wiring 204[1] becomes high, so that the transistor 105 in the circuit 21[1,1] is turned on. Thus, the potential of the node N3[1] becomes a potential corresponding to the potential of the node N2[1] after the exposure (imaging data).

The potential of the node N3[1] at this time is output to the circuit 51 as an optical data signal of the circuit 21[1,1]. Note that at this time, the potential of the wiring 209 is high and thus the transistor 122 is on, and the potential of the wiring 210 is high and thus the transistor 123 is on, so that the potentials of the node N4 and the wiring 215 do not change.

Next, in the period T6, the potential of the wiring 234 is set low and thus the potential of the wiring 203[1] becomes high, so that the transistor 103 in the circuit 21[1,1] is turned on. Therefore, the potential of the node N2[1] is reset to be high, i.e., the second reset is performed. Then, the potential of the node N3[1] becomes a potential corresponding to the potential of the node N2[1] that is reset. The potential of the node N3[1] at this time is output to the circuit 51 as a reset signal of the circuit 21[1,1].

In the period T6, the potential of the wiring 209 is low and thus the transistor 122 is off, so that the potential of the node N4 is in a floating state. When the reset signal is output to the node N3[1] and the potential thereof increases, the potential of the node N4 also increases via the capacitor 121. The potential of the node N4 is supplied to the wiring 215 via the transistor 123. Then, the potential of the wiring 215 is read, and the potential corresponding to the difference between the optical data signal read in the period T5 and the reset signal read in the period T6 can be output.

Next, in the period T7, the potential of the wiring 225 is set low and thus the potential of the wiring 204[2] becomes high, so that the transistor 105 in the circuit 21[2,1] is turned on. Thus, the potential of the node N3[2] becomes a potential corresponding to the potential of the node N2[2] after the exposure (imaging data). The potential of the node N3[2] at this time is output to the circuit 51 as an optical data signal of the circuit 21[2,1]. Note that at this time, the potential of the wiring 209 is high and thus the transistor 122 is on, and the potential of the wiring 210 is high and thus the transistor 123 is on, so that the potentials of the node N4 and the wiring 215 do not change.

Next, in the period T8, the potential of the wiring 235 is set low and thus the potential of the wiring 203[2] becomes high, so that the transistor 103 in the circuit 21[2,1] is turned on. Therefore, the potential of the node N2[2] is reset to be high, i.e., the second reset is performed. Then, the potential of the node N3[2] becomes a potential corresponding to the potential of the node N2[2] that is reset. The potential of the node N3[2] at this time is output to the circuit 51 as a reset signal of the circuit 21[2,1].

In the period T8, the potential of the wiring 209 is low and thus the transistor 122 is off, so that the potential of the node N4 is in a floating state. When the reset signal is output to the node N3[2] and the potential thereof increases, the potential of the node N4 also increases via the capacitor 121. The potential of the node N4 is supplied to the wiring 215 via the transistor 123.

Through similar operations, reading of an optical data signal and a reset signal and difference calculation are performed in the circuits 21 (circuit 21[3,1] to circuit 21[n,m]) in the third row to the last row.

After the reading operations in all the circuits 21 are finished, the potential of the wiring 236 is set high in the period T2 in the next frame, whereby the operation of the shift register 410 in the circuit 70 is forcibly terminated and the potentials of the wirings 203[1] and 203[2] are set low.

Note that in the above operations, one frame includes 46 clocks, and 6 clocks among them are used for the period of the first reset and the exposure in the pixel. Therefore, when clock frequency is 2.76 kHz in the circuits 60 and 70 and they output a selection signal for one row in one-fourth clock, the frame rate can be 60 fps. Note that the number of clocks can be freely determined as long as it is within one frame. For example, when the period of the first reset and the exposure is shortened to 3 clocks, one frame will be 43 clocks. In this case, the reading period in each row will increase.

As described above, in one embodiment of the present invention, difference between an optical data signal and a reset signal can be calculated. Therefore, even when an optical data signal includes noise, a signal where influence of the noise is lessened can be obtained and thus a semiconductor device with high reliability can be provided.

In one embodiment of the present invention, leakage of the charge obtained through the exposure can be prevented with the use of OS transistors for the circuits. Therefore, it is possible to retain the exposure data for a long time and to extend the dynamic range of detected light. In addition, even in case of performing imaging by a global shutter system, an accurate image signal data can be obtained.

In one embodiment of the present invention, optical data signals and reset signals can be read in this order row by row. Therefore, even when the exposure is performed in pixels in several rows and then reading is sequentially performed row by row, the difference between optical data signals and reset signals can be calculated row by row.

This embodiment can be combined with any other embodiment as appropriate. Thus, content (or may be part of the content) described in this embodiment may be applied to, combined with, or replaced by different content (or may be part of the different content) described in the embodiment and/or content (or may be part of the content) described in one or more different embodiments. Note that in each embodiment, content described in the embodiment is content described with reference to a variety of diagrams or content described with a text described in this specification. In addition, by combining a diagram (or part thereof) described in one embodiment with another part of the diagram, a different diagram (or part thereof) described in the same embodiment, and/or a diagram (or part thereof) described in another or other embodiments, much more diagrams can be formed. The same can be applied to any other embodiment Embodiment 2

In this embodiment, other structure and operation examples of one embodiment of the present invention are described.

Figure 9:
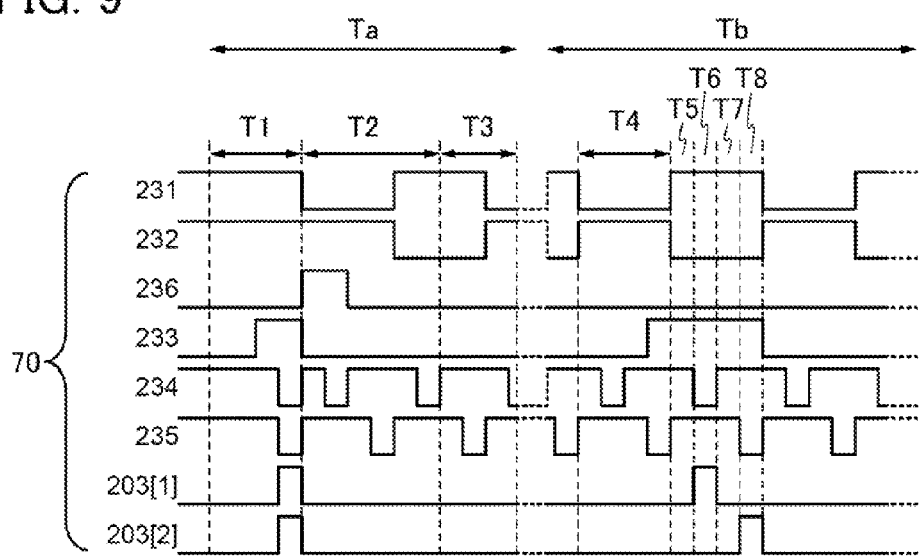
FIG. 9 is a timing chart.

FIG. 9 shows a timing chart of the circuit 70 different from that of FIG. 8. Here, the frequency of signals input to the wiring 234 is one-half of the frequency of signals in FIG. 8. Operations other than those explained below are the same as the operations shown in FIG. 8, and thus the detailed description is omitted.

In the period T1, the potentials of the wirings 231 and 232 are high. Accordingly, the terminals c1 and c2 in FIG. 5 and FIG. 7 are supplied with the high level potentials, whereby the terminals OUT of all the shift registers 410 are forcibly set high. In the period T1, the potential of the wiring 233 is set high, so that the terminals IN and OUT of all the shift registers 410 are supplied with the high level potential, and thus all the NANDs 420 output low level potentials. Then, the potentials of the wirings 234 and 235 are set low, whereby output of all the NORs 430 and the potentials of all the wirings 203 are set high. In this period, the potentials of the nodes N1 and N2 in FIG. 8 are reset to be high.

In the period T2, the potential of the wiring 233 is set low and the potential of the wiring 236 is set high, whereby the terminals OUT of all the shift registers 410 are forcibly set low. Therefore, output of all the NANDs 420 becomes at a high level, so that output of all the NORs 430 and the potentials of all the wirings 203 are set low.

In the period T8, the potential of the wiring 235 is set low, so that the potential of the wiring 203[2,1] is set high and the transistor 103 in the circuit 21[2,1] is turned on. Accordingly, the potential of the node N2[2] is reset to be high, i.e., the second reset is performed. Then, in accordance with the potential of the node N2[2] that is reset, the potential of the node N3[2] increases. Thus, a reset signal is output from the circuit 21[2,1] to the circuit 51.

Although the potential of the wiring 203[1] in the period T8 is high in synchronization with the potential of the wiring 234 in FIG. 8, the potential of the wiring 234 is high in FIG. 9 and thus the potential of the wiring 203[1] keeps low.

In addition, in FIG. 8, there is a period when the potential of the wiring 203[1] is needlessly high because the potential of the wiring 233 keeps high in and after the period T8. However, in FIG. 9, the potential of the wiring 203[1] is prevented from being needlessly high because the potential of the wiring 233 is low in and after the period T8. Accordingly, the power consumption of the circuit 70 can be reduced.

Figure 10:
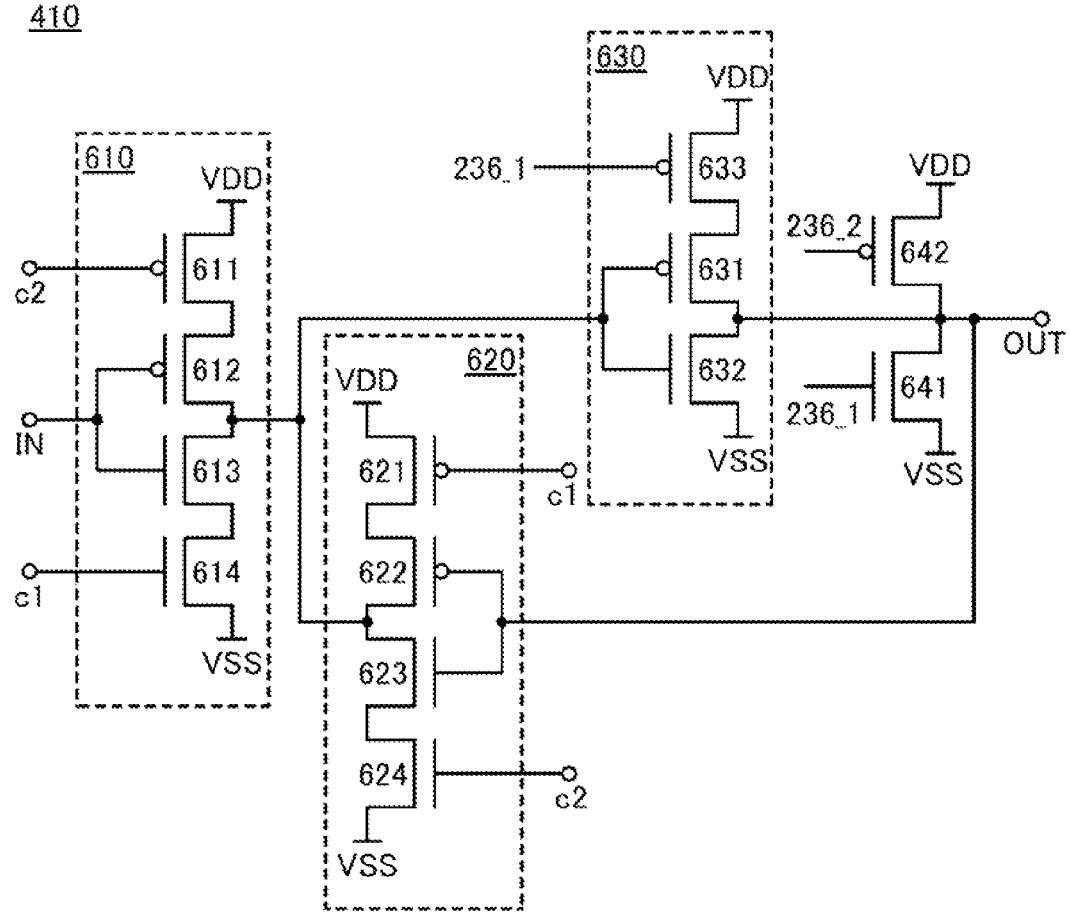
FIG. 10 is a circuit diagram illustrating an example of a structure of a semiconductor device.

The shift register 410 in the circuit 70 can have a structure shown in FIG. 10. The shift register 410 in FIG. 10 is different from the shift register 410 shown in FIG. 7 in that a transistor 642 is included. The other structures and connection relationships are the same as those of the shift register 410 in FIG. 7, so that the detailed description is omitted.

A gate of the transistor 642 is connected to a wiring 236_2, one of a source and a drain of the transistor 642 is connected to the high-voltage power source line VDD, and the other of the source and the drain of the transistor 642 is connected to the terminal OUT. In addition, the gates of the transistor 633 and the transistor 641 are connected to a wiring 236_1.

The on/off state of the transistor 642 is controlled by the potential of the wiring 236_2. When the transistor 642 is on, the potential of the terminal OUT is high. Therefore, output of the shift register 410 can be forcibly set high by controlling the potential of the wiring 236_2.

Figure 11:
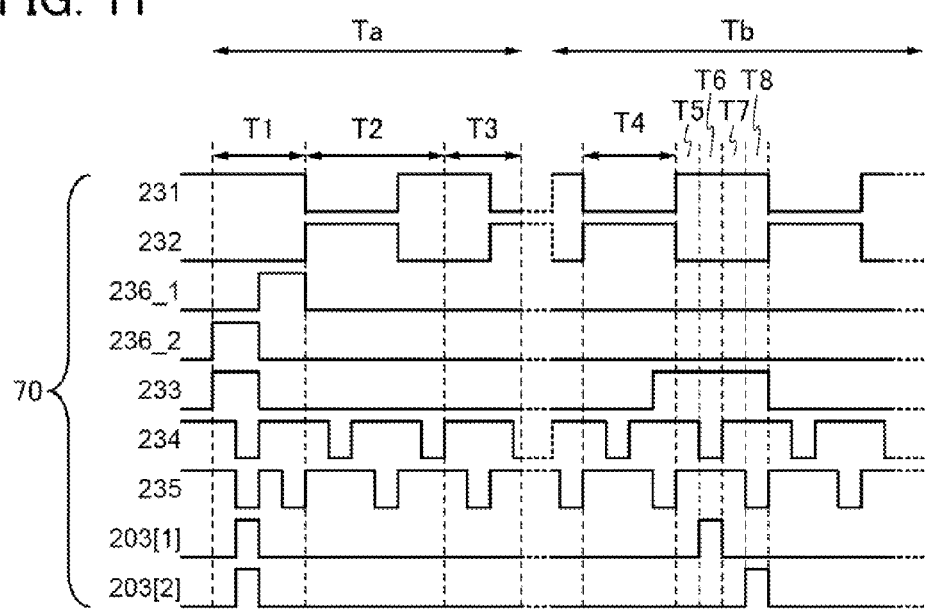
FIG. 11 is a timing chart.

A timing chart of FIG. 11 shows an operation example of the circuit 70 including the shift register 410 in FIG. 10. Operations other than those explained below are the same as the operations shown in FIG. 9, and thus the detailed description is omitted.

In the period T1, the potential of the wiring 236_2 is set high. Accordingly, the terminals OUT of all the shift registers 410 are supplied with a high potential, so that output of the shift registers 410 are forcibly set high. In the period T1, the potential of the wiring 233 is set high, so that the terminals IN and OUT of all the shift registers 410 are supplied with high level potentials and all the NANDs 420 output low level potentials. Then, the potentials of the wirings 234 and 235 are set low, whereby output of all the NORs 430 and the potentials of all the wirings 203 become high. In this period, the potentials of the nodes N1 and N2 in FIG. 8 are reset to be high.

After that, the potential of the wiring 233 is set low, the potential of the wiring 236_1 is set high, and the potential of the wiring 236_2 is set low, whereby the terminals OUT of all the shift registers 410 are forcibly set low. Therefore, output of all the NANDs 420 becomes at a high level, so that output of all the NORs 430 and the potential of all the wirings 203 are set low.

This embodiment can be combined with any other embodiment as appropriate.

Embodiment 3

In this embodiment, an imaging device including the semiconductor device of one embodiment of the present invention is described.

Figure 12:
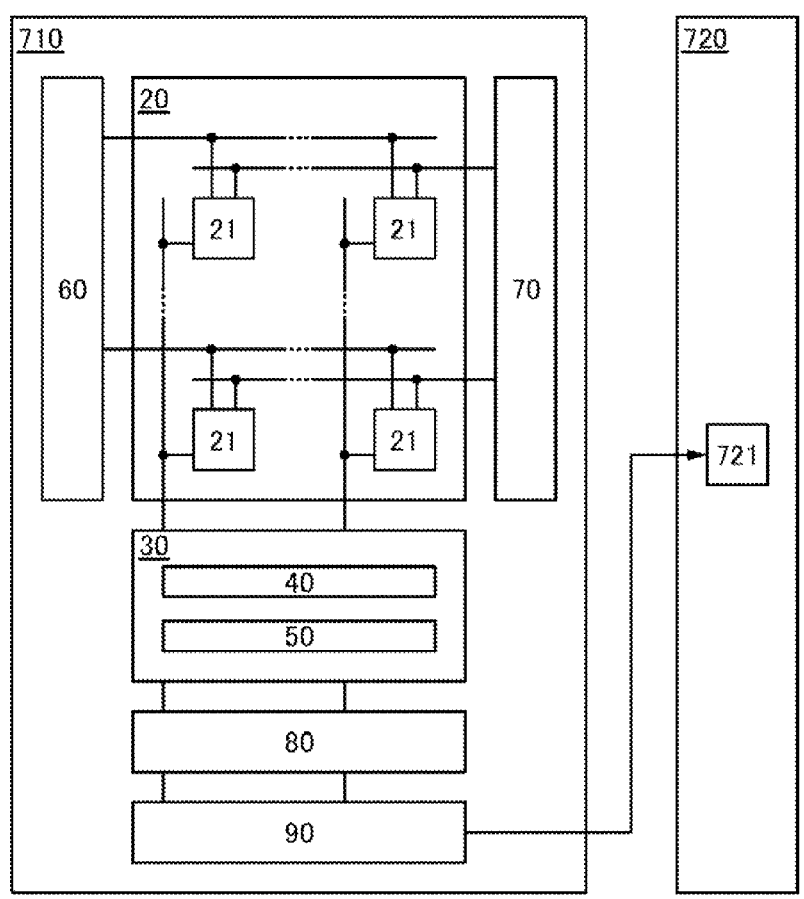
FIG. 12 illustrates an example of a structure of an imaging device.

FIG. 12 illustrates a structure example of an imaging device 700. The imaging device 700 includes a photodetector portion 710 and a data processing portion 720.

The photodetector portion 710 includes circuits 20, 30, 60, 70, 80 and 90. As the circuits 20, 30, 60, and 70, the circuits described in Embodiments 1 and 2 can be used.

The circuit 80 has a function of converting an analog signal input from the circuit 30 into a digital signal. The circuit 80 can be composed of an A/D converter and the like.

The circuit 90 is a driving circuit having a function of reading a digital signal input from the circuit 80. Specifically, the circuit 90 has a function of reading a digital signal corresponding to difference data calculated in the circuit 30 and outputting the digital signal to the outside.

The circuit 90 can be composed of a selection circuit and the like. The selection circuit can be formed using a transistor. The transistor can be an OS transistor or the like.

The data processing portion 720 includes a circuit 721. The circuit 721 has a function of generating image data with the use of the digital signal corresponding to the difference data generated in the photodetector portion 710.

The circuit 20 may include a circuit having a function of displaying an image. With such a structure, the imaging device 700 can serve as a touch panel.

Next, an example of a driving method of the imaging device 700 in FIG. 12 is described.

First, an optical data signal is generated in the circuit 21. When image capture is performed in the plurality of circuits 21 by a global shutter system, distortion of an image to be generated can be suppressed. The optical data signal generated in the circuit 21 is output to the circuit 30.

After that, a reset signal is generated in the circuit 21. The reset signal generated in the circuit 21 is output to the circuit 30.

Here, in the circuit 30, the difference between the optical data signal and the reset signal input from the circuit 21 is calculated. The difference calculation can be performed by the methods described in Embodiments 1 and 2. The difference calculated in the circuit 30 is output to the circuit 80 as an analog signal.

The analog signal output from the circuit 30 is converted into a digital signal in the circuit 80, and the digital signal is output to the circuit 90. The circuit 90 reads the digital signal. The digital signal read in the circuit 90 is used for processing in the circuit 721 and the like.

In this way, in the imaging device of one embodiment of the present invention, the difference is calculated with the use of an analog signal, and then the difference is converted into a digital signal. Therefore, noise is not amplified when conversion into the digital signal is performed, and removal of noise can be effectively performed. Thus, the accuracy of a captured image can be improved.

This embodiment can be combined with any other embodiment as appropriate.

Embodiment 4

In this embodiment, structure examples of an element that can be used in the semiconductor device 10 are described.

Figure 13A:
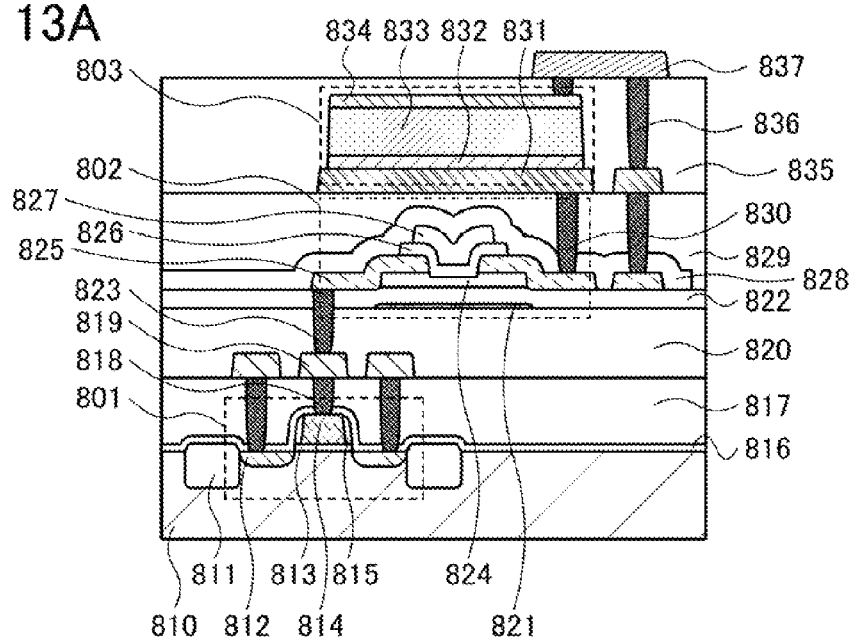
FIGS. 13A to 13C each illustrate an example of a cross-sectional structure of a semiconductor device.
Figure 13B:
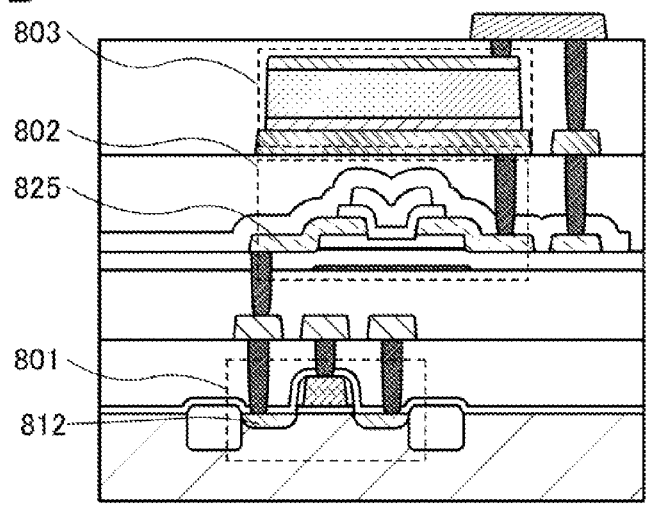
Figure 13C:
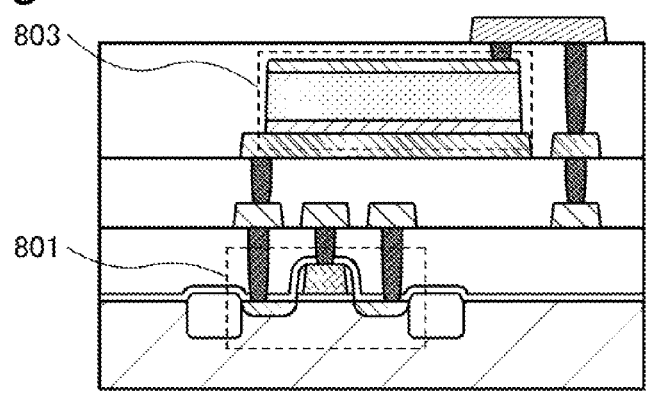

FIGS. 13A to 13C show structure examples of transistors and a photoelectric conversion element that can be used in the semiconductor device 10. A photodiode is used as the photoelectric conversion element, as an example, in this embodiment.

FIG. 13A shows a structure example of a transistor 801, a transistor 802, and a photodiode 803. The transistor 801 is connected to the transistor 802 through a wiring 819 and a conductive layer 823, and the transistor 802 is connected to the photodiode 803 through a conductive layer 830.

The transistor 802 is stacked over the transistor 801, and the photodiode 803 is stacked over the transistor 802. The transistors in the semiconductor device are stacked in this way, whereby the area of the semiconductor device can be reduced.

The transistors 801 and 802 can be used as any of the transistors shown in FIG. 2, FIGS. 3A to 3D, FIG. 6, FIG. 7, and FIG. 10. For example, the transistor 801, the transistor 802, and the photodiode 803 can be used as the transistor 104 in FIG. 2, the transistor 102 or 103 in FIG. 2, and the photoelectric conversion element 101 in FIG. 2, respectively. However, elements for which the transistor 801, the transistor 802, and the photodiode 803 can be used are not limited thereto.

First, the transistor 801 is described.

The transistor 801 is formed using a semiconductor substrate 810 and includes element separation layers 811 over the semiconductor substrate 810 and impurity regions 812 formed in the semiconductor substrate 810. The impurity regions 812 have a function as a source region and a drain region of the transistor 801, and a channel region is formed between the impurity regions 812. The transistor 801 further includes an insulating layer 813 and a conductive layer 814. The insulating layer 813 has a function as a gate insulating layer of the transistor 801, and the conductive layer 814 has a function as a gate electrode of the transistor 801. Note that a side wall 815 may be formed on the side surface of the conductive layer 814. Furthermore, an insulating layer 816 having a function as a protective layer and an insulating layer 817 having a function as a planarization film can be formed over the conductive layer 814.

A silicon substrate is used as the semiconductor substrate 810. Note that germanium, silicon germanium, silicon carbide, gallium arsenide, aluminum gallium arsenide, indium phosphide, gallium nitride, or an organic semiconductor besides silicon can be used as a material of the substrate.

The element separation layer 811 can be formed by a local oxidation of silicon (LOCOS) method, a shallow trench isolation (STI) method, or the like.

The impurity regions 812 include an impurity element imparting conductivity to the material of the semiconductor substrate 810. When a silicon substrate is used as the semiconductor substrate 810, phosphorus, arsenic, or the like is used as the impurity imparting n-type conductivity, and boron, aluminum, gallium, or the like is used as the impurity imparting p-type conductivity. The impurity element can be added to a predetermined region of the semiconductor substrate 810 by an ion implantation method, an ion doping method, or the like.

The insulating layer 813 can be formed using an insulating layer containing at least one of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. Alternatively, the insulating layer 813 may be formed using stacked insulating layers each containing one or more of the above materials.

The conductive layer 814 can be formed using a conductive film of aluminum, titanium, chromium, cobalt, nickel, copper, yttrium, zirconium, molybdenum, silver, manganese, tantalum, tungsten, or the like. It is also possible to use an alloy or conductive nitride of any of these materials. It is also possible to use a stack of a plurality of materials selected from these materials, alloys of these materials, and conductive nitride of these materials.

The insulating layer 816 can be formed using an insulating layer containing at least one of magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. Alternatively, the insulating layer 816 may be formed using stacked insulating layers each containing one or more of the above materials.

An organic material such as an acrylic resin, an epoxy resin, a benzocyclobutene resin, polyimide, or polyamide can be used for the insulating layer 817. Alternatively, the insulating layer 817 may be formed using stacked insulating layers each containing one or more of the above materials.

Note that the conductive layer 814 can be connected to the wiring 819 via a conductive layer 818.

Next, the transistor 802 is described.

The transistor 802 includes an oxide semiconductor layer 824 over an insulating layer 822, conductive layers 825 over the oxide semiconductor layer 824, an insulating layer 826 over the conductive layers 825, and a conductive layer 827 over the insulating layer 826. The conductive layers 825 have a function as a source electrode and a drain electrode of the transistor 802. The insulating layer 826 has a function as a gate insulating layer of the transistor 802. The conductive layer 827 has a function as a gate electrode of the transistor 802. Furthermore, an insulating layer 828 having a function as a protective layer and an insulating layer 829 having a function as a planarization film can be formed over the conductive layer 827.

A conductive layer 821 may be formed under the insulating layer 822. In that case, the conductive layer 821 has a function as a back gate electrode of the transistor 802. In the case where the conductive layer 821 is formed, the conductive layer 821 can be formed over the insulating layer 820 that is formed over the wiring 819. Alternatively, part of the wiring 819 may serve as a back gate electrode of the transistor 802. An OS transistor with a back gate electrode can be used for the transistors in FIG. 2, FIGS. 3A to 3D, FIG. 6, FIG. 7, and FIG. 10.

When a transistor T includes a pair of gates that sandwiches a semiconductor film as in the transistor 802, one of the gates may be supplied with a signal A and the other of the gates may be supplied with a fixed potential Vb. Alternatively, the one of the gates may be supplied with the signal A and the other of the gates may be supplied with a signal B. Alternatively, the one of the gates may be supplied with a fixed potential Va and the other of the gates may be supplied with the fixed potential Vb.

The signal A is, for example, a signal for controlling the on/off state. The signal A may be a digital signal with two kinds of potentials, V1 and V2 (V1>V2). For example, the potential V1 may be a high power source potential and the potential V2 may be a low power source potential. The signal A may be an analog signal.

The fixed potential Vb is, for example, a potential for controlling a threshold voltage VthA that is set by one of the gates of the transistor T. The fixed potential Vb may be the potential V1 or the potential V2. In that case, a special potential generator circuit is not necessary. The fixed potential Vb may be different from the potential V1 or the potential V2. When the fixed potential Vb is low, the threshold voltage VthA can be increased in some cases. As a result, a drain current of when a voltage Vgs between the gate and a source is 0 V can be reduced and a leakage current of the circuit including the transistor T can be reduced in some cases. The fixed potential Vb may be, for example, lower than the low power source potential. When the fixed potential Vb is high, the threshold voltage VthA may be decreased in some cases. As a result, a drain current of when the voltage Vgs between the gate and the source is VDD can be increased and operation speed of the circuit including the transistor T can be increased in some cases. The fixed potential Vb may be, for example, higher than the low power source potential.

The signal B is, for example, a signal for controlling the on/off state. The signal B may be a digital signal with two kinds of potentials, V3 and V4 (V3>V4). For example, the potential V3 may be the high power source potential and the potential V4 may be the low power source potential. The signal B may be an analog signal.

When both the signal A and the signal B are digital signals, the signal B may have the same digital value as the signal A. In that case, an on-state current of the transistor T may be increased and operation speed of the circuit including the transistor T may be increased in some cases. Here, the potentials V1 and V2 of the signal A may be different from the potentials V3 and V4 of the signal B. For example, if a gate insulating film used with the gate to which the signal B is input is thicker than a gate insulating film used with the gate to which the signal A is input, the potential amplitude of the signal B (V3–V4) can be larger than the potential amplitude of the signal A (V1–V2). In this way, influence of the signal A and that of the signal B on the on/off state of the transistor T can be approximately the same in some cases.

When both the signal A and the signal B are digital signals, the signal B may be a signal with a different digital value from that of the signal A. In that case, the signal A and the signal B can separately control the transistor T, and thus higher performance may be achieved. For example, if the transistor T is an n-channel transistor, the transistor T may be turned on only when the signal A has the potential V1 and the signal B has the potential V3, or may be turned off only when the signal A has the potential V2 and the signal B has the potential V4, in which case the transistor T, a single transistor, may function as a NAND circuit, a NOR circuit, or the like. In addition, the signal B may be a signal for controlling the threshold voltage VthA. For example, the potential of the signal B in a period when the circuit including the transistor T operates may be different from the potential of the signal B in a period when the circuit does not operate. The potential of the signal B may vary depending on operation modes of the circuit. In that case, the potential of the signal B is not switched so often as that of the signal A in some cases.

When both the signal A and the signal B are analog signals, the signal B may be an analog signal with the same potential as that of the signal A, an analog signal with a potential that is a constant multiple of the potential of the signal A, an analog signal with a potential that is higher or lower than the potential of the signal A by a constant, or the like. In that case, an on-state current of the transistor T may be increased and operation speed of the circuit including the transistor T may be increased in some cases. The signal B may be an analog signal different from the signal A. In that case, the signal A and the signal B can separately control the transistor T, and thus higher performance may be achieved.

The signal A and the signal B may be a digital signal and an analog signal, respectively. The signal A and the signal B may be an analog signal and a digital signal, respectively.

When both of the gates of the transistor T are supplied with the fixed potentials, the transistor T can serve as an element equivalent to a resistor in some cases. For example, when the transistor T is an n-channel transistor, effective resistance of the transistor can be decreased (increased) by heightening (lowering) the fixed potential Va or the fixed potential Vb in some cases. When both the fixed potential Va and the fixed potential Vb are heightened (lowered), effective resistance lower (higher) than that obtained by the transistor with one gate can be obtained in some cases.

The insulating layer 822 can be formed using an insulating layer containing at least one of magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. Alternatively, the insulating layer 822 may be formed using stacked insulating layers each containing one or more of the above materials. Note that it is preferable that the insulating layer 822 have a function of supplying oxygen to the oxide semiconductor layer 824. This is because even in the case where oxygen vacancies are present in the oxide semiconductor layer 824, the oxygen vacancies are repaired by oxygen supplied from the insulating layer. An example of treatment for supplying oxygen is heat treatment.

An oxide semiconductor can be used for the oxide semiconductor layer 824. As the oxide semiconductor, for example, any of the following can be used: indium oxide, tin oxide, gallium oxide, zinc oxide, In—Zn oxide, Sn—Zn oxide, Al—Zn oxide, Zn—Mg oxide, Sn—Mg oxide, In—Mg oxide, In—Ga oxide, In—Ga—Zn oxide, In—Al—Zn oxide, In—Sn—Zn oxide. Sn—Ga—Zn oxide, Al—Ga—Zn oxide, Sn—Al—Zn oxide, In—Hf—Zn oxide, In—La—Zn oxide, In—Ce—Zn oxide, In—Pr—Zn oxide, In—Nd—Zn oxide, In—Sm—Zn oxide, In—Eu—Zn oxide, In—Gd—Zn oxide, In—Tb—Zn oxide, In—Dy—Zn oxide, In—Ho—Zn oxide, In—Er—Zn oxide, In—Tm—Zn oxide, In—Yb—Zn oxide, In—Lu—Zn oxide, In—Sn—Ga—Zn oxide, In—Hf—Ga—Zn oxide, In—Al—Ga—Zn oxide, In—Sn—Al—Zn oxide. In—Sn—Hf—Zn oxide, and In—Hf—Al—Zn oxide. In particular, In—Ga—Zn oxide is preferable.

Here, In—Ga—Zn oxide means oxide containing In, Ga, and Zn as its main components. Note that a metal element other than In, Ga, and Zn may be contained as an impurity. Note that a film formed using In—Ga—Zn oxide is also referred to as an IGZO film.

The conductive layer 825 can be formed using a conductive film of aluminum, titanium, chromium, cobalt, nickel, copper, yttrium, zirconium, molybdenum, silver, manganese, tantalum, tungsten, or the like. It is also possible to use an alloy or conductive nitride of any of these materials. It is also possible to use a stack of a plurality of materials selected from these materials, alloys of these materials, and conductive nitride of these materials. Typically, it is preferable to use titanium, which is particularly easily bonded to oxygen, or tungsten, which has a high melting point and thus allows subsequent process temperatures to be relatively high. It is also possible to use a stack of any of the above materials and copper or an alloy such as copper-manganese, which has low resistance. When a material which is easily bonded to oxygen is used for the conductive layer 825, and the conductive layer 825 and the oxide semiconductor layer 824 are in contact with each other, a region including oxygen vacancies is formed in the oxide semiconductor layer 824. Hydrogen slightly contained in the film is diffused into the oxygen vacancies, whereby the region is markedly changed to an n-type region. The n-type region can function as a source region or a drain region of the transistor.

The insulating layer 826 can be formed using an insulating layer containing at least one of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. Alternatively, the insulating layer 826 may be formed using stacked insulating layers each containing one or more of the above materials.

The conductive layer 827 can be formed using a conductive film of aluminum, titanium, chromium, cobalt, nickel, copper, yttriumn, zirconium, molybdenum, silver, manganese, tantalum, tungsten, or the like. It is also possible to use an alloy or conductive nitride of any of these materials. It is also possible to use a stack of a plurality of materials selected from these materials, alloys of these materials, and conductive nitride of these materials.

The insulating layer 828 can be formed using an insulating film containing at least one of magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. Alternatively, the insulating layer 828 may be formed using stacked insulating layers each containing one or more of the above materials.

An organic material such as an acrylic resin, an epoxy resin, a benzocyclobutene resin, polyimide, or polyamide can be used for the insulating layer 829. Alternatively, the insulating layer 829 may be formed using stacked insulating layers each containing one or more of the above materials.

Next, the photodiode 803 is described.

In the photodiode 803, an n-type semiconductor layer 832, an i-type semiconductor layer 833, and a p-type semiconductor layer 834 are stacked in this order.

The i-type semiconductor layer 833 is preferably formed using amorphous silicon. Furthermore, the n-type semiconductor layer 832 and the p-type semiconductor layer 834 can be formed using amorphous silicon or microcrystalline silicon including an impurity imparting conductivity. A photodiode using amorphous silicon is preferable because its sensitivity in a wavelength region of visible light is high. Note that the p-type semiconductor layer 834 serves as a light-receiving surface, whereby the output current of the photodiode can be increased.

The n-type semiconductor layer 832 having a function as a cathode is connected to the conductive layer 825 of the transistor 802 via the conductive layer 830. Furthermore, the p-type semiconductor layer 834 having a function as an anode is connected to a wiring 837. The photodiode 803 may be connected to another wiring via a wiring 831 or a conductive layer 836. Furthermore, an insulating layer 835 having a function as a protective film can be formed.

Although the conductive layer 814 is connected to the conductive layer 825 in FIG. 13A, that is, a gate of the transistor 801 is connected to one of a source and a drain of the transistor 802, the connection relation between the transistor 801 and the transistor 802 is not limited thereto. For example, as shown in FIG. 13B, the impurity region 812 may be connected to the conductive layer 825, that is, one of a source and a drain of the transistor 801 may be connected to one of the source and the drain of the transistor 802. When the transistor 801, the transistor 802, and the photodiode 803 overlap each other, the area of the semiconductor device can be further reduced.

Although not illustrated, the gate of the transistor 801 may be connected to a gate of the transistor 802, or the impurity region 812 of the transistor 801 may be connected to the gate of the transistor 802. Such a structure may be appropriately used in the circuits shown in FIG. 2, FIGS. 3A to 3D, FIG. 6, FIG. 7, and FIG. 10.

Alternatively, as shown in FIG. 13C, the OS transistor may be omitted and the photodiode 803 may be connected to the transistor 801. In this way, the manufacturing steps of the semiconductor device can be reduced by omission of the OS transistor.

Figure 14A:
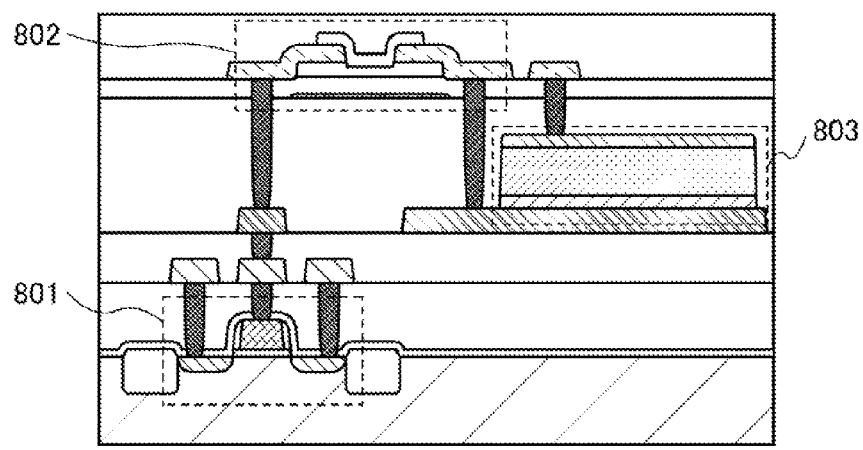
FIGS. 14A to 14C each illustrate an example of a cross-sectional structure of a semiconductor device.

Although the photodiode 803 is stacked over the transistor 802 in FIGS. 13A to 13C, the position of the photodiode 803 is not limited thereto. For example, as shown in FIG. 14A, the photodiode 803 may be provided between the transistor 801 and the transistor 802.

Figure 14B:
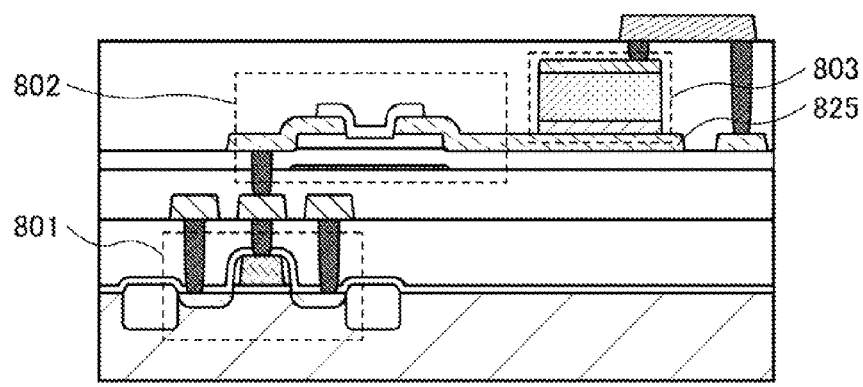

Alternatively, as shown in FIG. 14B, the photodiode 803 may be provided in the layer where the transistor 802 is provided. In that case, the conductive layer 825 may be used as the source electrode or the drain electrode of the transistor 802 and an electrode of the photodiode 803.

Figure 14C:
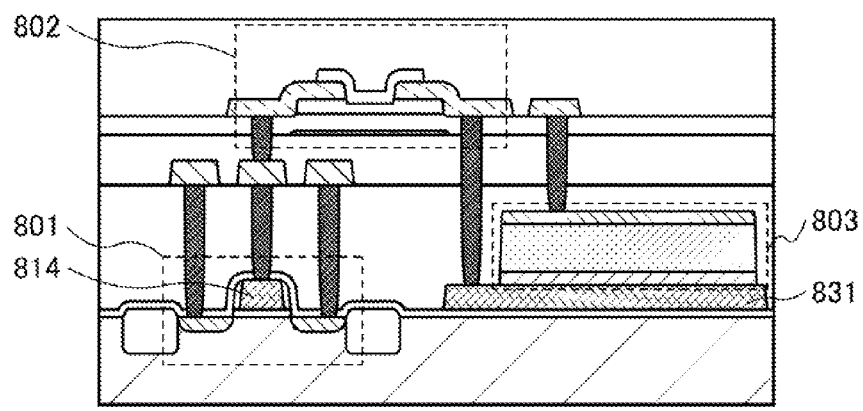

Alternatively, as shown in FIG. 14C, the photodiode 803 may be provided in the layer where the transistor 801 is provided. In that case, the conductive layer 814 having a function as the gate electrode of the transistor 801 and the wiring 831 having a function as the electrode of the photodiode 803 may be formed with the same material at a time.

Figure 15A:
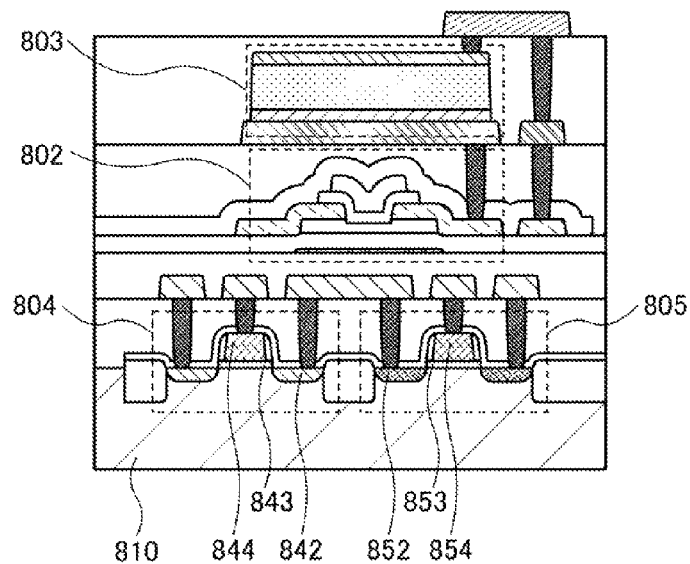

A plurality of transistors can be formed using the semiconductor substrate 810. FIG. 15A shows an example where a transistor 804 and a transistor 805 are formed using the semiconductor substrate 810.

The transistor 804 includes impurity regions 842, an insulating layer 843 having a function as a gate insulating film, and a conductive layer 844 having a function as a gate electrode. The transistor 805 includes impurity regions 852, an insulating film 853 having a function as a gate insulating film, and a conductive layer 854 having a function as a gate electrode. Structures and materials of the transistors 804 and 805 are the same as those of the transistor 801, and thus the detailed description is omitted.

The impurity regions 842 includes an impurity element imparting opposite conductivity to conductivity of the impurity regions 852. That is, the transistor 804 has an opposite polarity to the polarity of the transistor 805. In addition, as shown in FIG. 15A, the impurity region 842 may be connected to the impurity region 852. In that case, a complementary metal oxide semiconductor (CMOS) inverter including the transistor 804 and the transistor 805 can be formed. The transistor 804 and the transistor 805 can be used for the inverters and the clocked inverters shown in FIG. 6, FIG. 7, and FIG. 10.

With the use of the structure shown in FIG. 15A, the circuits 60 and 70 shown in FIGS. 1A and 1B, FIG. 4, FIG. 5, FIG. 6, FIG. 7, and FIG. 10 can be formed with transistors formed using the semiconductor substrate 810, and the circuits 21, 41, and 51 shown in FIGS. 1A and 1B, FIG. 2, and FIGS. 3A to 3D can be formed with OS transistors formed over the transistors formed using the semiconductor substrate 810. That is, the circuits 20 and 30 can be stacked over the circuits 60 and 70. Thus, the area of the semiconductor device can be reduced.

Figure 15B:
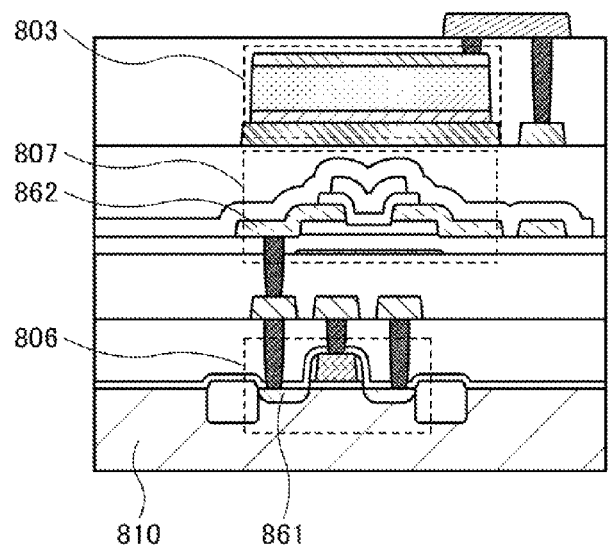

In a structure where a transistor 807 that is an OS transistor is stacked over a transistor 806 formed using the semiconductor substrate 810 as shown in FIG. 15B, an impurity region 861 may be connected to a conductive layer 862, that is, a source or a drain of the transistor 806 may be connected to a source or a drain of the transistor 807. In this way, a CMOS inverter including the transistor formed using the semiconductor substrate 810 and the OS transistor can be formed.

The transistor 806 formed using the semiconductor substrate 810 is easily formed to be a p-channel transistor as compared with the OS transistor. Therefore, it is preferable that the transistor 806 be a p-channel transistor and the transistor 807 be an n-channel transistor. In this way, a CMOS inverter can be formed without formation of two kinds of transistors with different polarities using the semiconductor substrate 810, whereby the manufacturing steps of the semiconductor device can be reduced.

This embodiment can be combined with any other embodiment as appropriate.

Embodiment 5

In this embodiment, a structure example of an imaging device to which a color filter and the like are added is described.

Figure 16A:
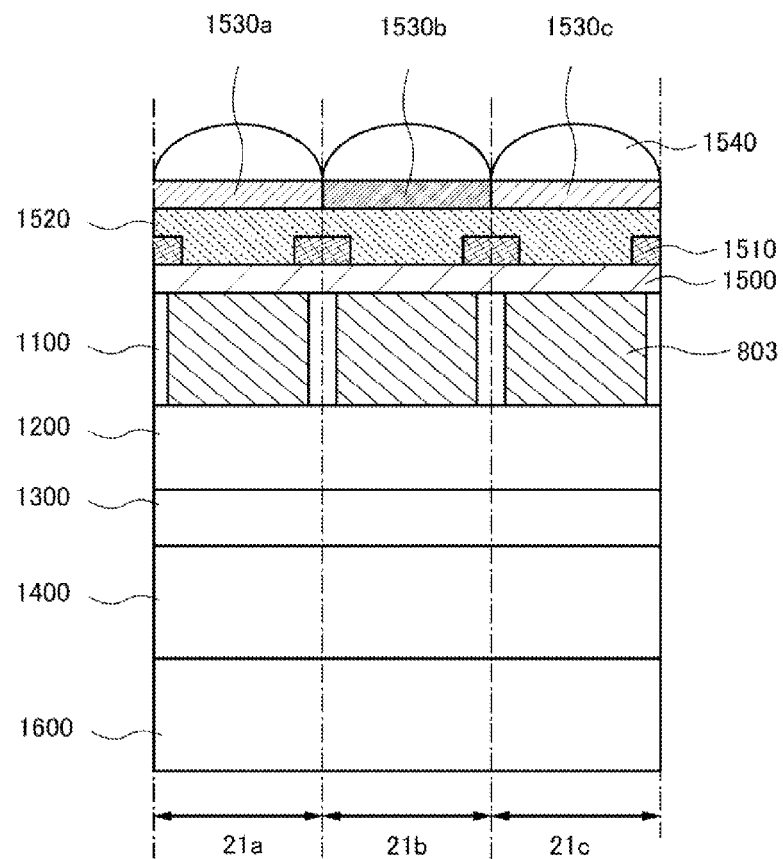
FIGS. 16A and 16B each illustrate an example of a structure of an imaging device.

FIG. 16A is a cross-sectional view of an example of an embodiment in which a color filter and the like are added to the structure in any of FIGS. 13A to 13C, FIGS. 14A to 14C, FIGS. 15A and 15B, and the like, and illustrates a region occupied by circuits (circuits 21a, 21b, and 21c) corresponding to three pixels. An insulating layer 1500 is formed over the photodiode 803 provided in the layer 1100. As the insulating layer 1500, for example, a silicon oxide film with a high visible-light transmitting property can be used. In addition, a silicon nitride film may be stacked as a passivation film. In addition, a dielectric film of hafnium oxide or the like may be stacked as an anti-reflection film.

A light-blocking layer 1510 is formed over the insulating layer 1500. The light-blocking layer 1510 has a function of inhibiting color mixing of light passing through the color filter. The light-blocking layer 1510 can be formed using a metal layer of aluminum, tungsten, or the like, or a stack including the metal layer and a dielectric film functioning as an anti-reflection film.

An organic resin layer 1520 is formed as a planarization film over the insulating layer 1500 and the light-blocking layer 1510. A color filter 1530a, a color filter 1530b, and a color filter 1530c are formed over the circuit 21a, the circuit 21b, and the circuit 21c to be paired up with the circuit 21a, the circuit 21b, and the circuit 21c, respectively. The color filter 1530a, the color filter 1530b, and the color filter 1530c have colors of R (red), G (green), B (blue), and the like, whereby a color image can be obtained.

A microlens array 1540 is provided over the color filters 1530a, 1530b, and 1530c so that light penetrating a lens goes through the color filter positioned just below the lens to reach the photodiode.

A supporting substrate 1600 is provided in contact with the layer 1400. As the supporting substrate 1600, a hard substrate such as a semiconductor substrate (e.g., a silicon substrate), a glass substrate, a metal substrate, or a ceramic substrate can be used.

Note that an inorganic insulating layer or an organic resin layer as an adhering layer may be between the layer 1400 and the supporting substrate 1600.

Figure 16B:
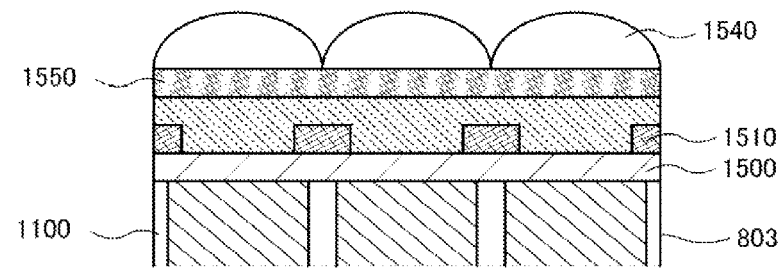

In the structure of the imaging device, an optical conversion layer 1550 (see FIG. 16B) may be used instead of the color filters 1530a, 1530b, and 1530c. When the optical conversion layer 1550 is used instead, the imaging device can convert light in various wavelength regions into an image.

For example, when a filter which blocks light having a wavelength shorter than or equal to that of visible light is used as the optical conversion layer 1550, an infrared imaging device can be obtained. When a filter which blocks light having a wavelength shorter than or equal to that of near infrared light is used as the optical conversion layer 1550, a far-infrared imaging device can be obtained. When a filter which blocks light having a wavelength longer than or equal to that of visible light is used as the optical conversion layer 1550, an ultraviolet imaging device can be obtained.

Furthermore, when a scintillator is used as the optical conversion layer 1550, an imaging device which takes an image visualizing the intensity of a radiation, such as a medical X-ray imaging device, can be obtained. Radiations such as X-rays passes through a subject to enter a scintillator, and then is converted into light (fluorescence) such as visible light or ultraviolet light owing to a phenomenon known as photoluminescence. Then, the photodiode 803 detects the light to obtain image data.

The scintillator is formed of a substance that, when irradiated with radiations such as X-rays or gamma-rays, absorbs energy of the radiations to emit visible light or ultraviolet light or a material containing the substance. For example, materials such as $Gd_2O_2S$:Tb, $Gd_2O_2S$:Pr, $Gd_2O_2S$:Eu, BaFCl:Eu, NaI, CsI, $CaF_2$, $BaF_2$, $CeF_3$, LiF, LiI, and ZnO and a resin or ceramics in which any of the materials is dispersed are known.

This embodiment can be combined with any other embodiment as appropriate.

Embodiment 6

In this example, other structure examples of the semiconductor device 10 are described.

Figure 17A:
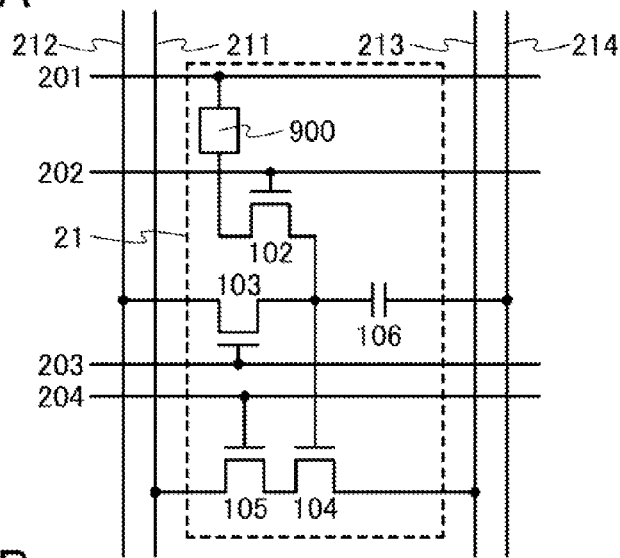
FIGS. 17A to 17C each illustrate an example of a structure of a semiconductor device.

A structure example of the circuit 21 is shown in FIG. 17A. In the circuit 21 in FIG. 17A, an element 900 including a selenium-based semiconductor is used as the photoelectric conversion element 101 shown in FIG. 2.

The element including the selenium-based semiconductor is an element which is capable of conducting photoelectric conversion utilizing a phenomenon called avalanche multiplication, in which a plurality of electrons can be taken from one incident photon by application of voltage. Therefore, in the circuit 21 including the selenium-based semiconductor element, the gain of electrons to the amount of incident light can be large: therefore, a highly sensitive sensor can be obtained.

For the selenium-based semiconductor, a selenium-based semiconductor with an amorphous structure or a selenium-based semiconductor with a crystalline structure can be used. For example, the selenium-based semiconductor with a crystalline structure may be obtained in such a manner that a selenium-based semiconductor with an amorphous structure is deposited and subjected to heat treatment. Note that it is preferable that the crystal grain diameter of the selenium-based semiconductor with a crystalline structure be smaller than a pixel pitch because variation in characteristics of the pixels is reduced and the image quality of an image to be obtained becomes uniform.

A selenium-based semiconductor with a crystalline structure among the selenium-based semiconductors has a characteristic of having a light absorption coefficient in a wide wavelength range. Therefore, the element using selenium-based semiconductor with a crystalline structure can be used as an imaging element for a wide wavelength range of light, such as visible light, ultraviolet light, X-rays, and gamma rays, and can be used as what is called a direct conversion element, which is capable of directly converting light in a short wavelength range, such as X-rays and gamma rays, into electric charge.

Figure 17B:
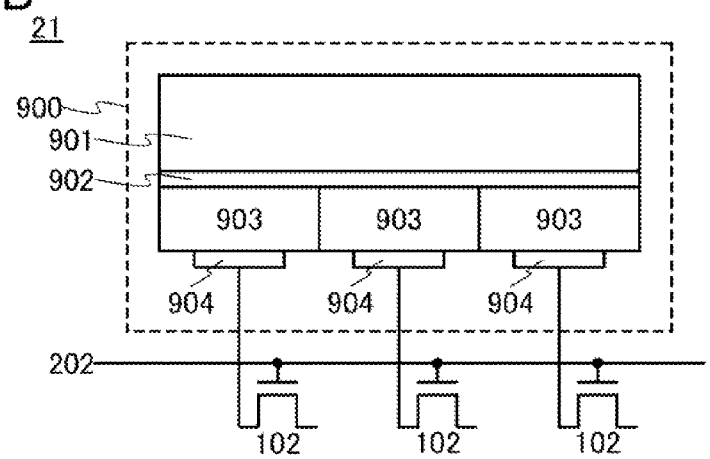

A structure example of the element 900 is shown in FIG. 17B. The element 900 includes a substrate 901, an electrode 902, selenium-based semiconductors 903, and electrodes 904. The electrode 904 is connected to the source or the drain of the transistor 102. Here, the element 900 includes the plurality of selenium-based semiconductors 903 and the plurality of electrodes 904, and each of the plurality of electrodes 904 is connected to the corresponding transistor 102: however, there is no particular limitation on the number of the selenium-based semiconductors 903 and that of the electrodes 904, and one or more of the selenium-based semiconductors 903 and one or more of the electrodes 904 may be provided for the transistor 102.

Light is to be incident on the selenium-based semiconductors 903 through the substrate 901 and the electrode 902. Therefore, the substrate 901 and the electrode 902 preferably have a light-transmitting property. As the substrate 901, a glass substrate can be used. As the electrode 902, indium tin oxide (ITO) can be used.

The selenium-based semiconductors 903 and the electrode 902 stacked over the selenium based semiconductors 903 can be used without processing of their shape for respective circuits 21. Therefore, a step for processing the shape can be omitted, which leads to a reduction in the manufacturing cost and improvement in the manufacturing yield.

For example, a chalcopyrite-based semiconductor can be used for the selenium-based semiconductor 903. Specifically, $CuIn_{1-3}Ga_2Se_2$ ($0 \leq x \leq 1$, abbreviated to CIGS) can be used. CIGS can be formed by an evaporation method, a sputtering method, or the like.

When a chalcopyrite-based semiconductor is used as the selenium-based semiconductor 903, avalanche multiplication can be caused by application of voltage of approximately 5 V to 20 V. Thus, by application of voltage to the selenium-based semiconductor 903, the movement of signal charge generated owing to light irradiation can have high linearity. Note that when the thickness of the selenium-based semiconductor 903 is smaller than or equal to 1 μm, the application voltage can be made smaller.

Figure 17C:
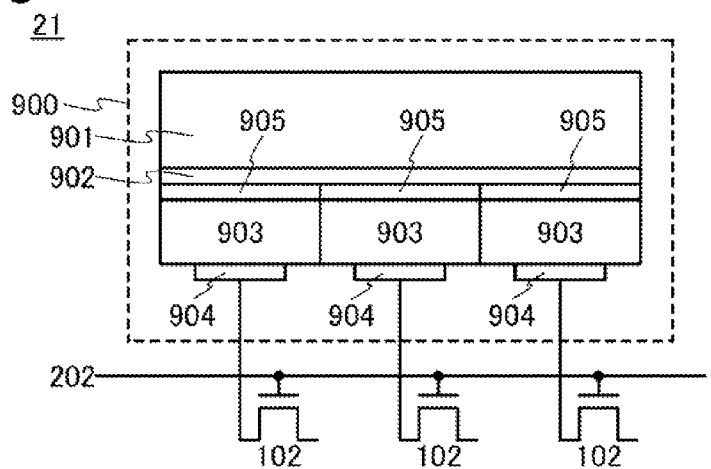

Note that in the case where the thickness of the selenium-based semiconductor 903 is small, dark current flows at the time of application of voltage; however, such dark current flow can be prevented by providing a layer (hole-injection barrier layer) for inhibiting the dark current from flowing in the CIGS that is the above-mentioned chalcopyrite-based semiconductor. FIG. 17C shows a structure in which a hole-injection barrier layer 905 is added to the structure of FIG. 17B.

An oxide semiconductor such as gallium oxide can be used for the hole-injection barrier layer. The thickness of the hole-injection barrier layer is preferably smaller than that of the selenium-based semiconductor 903.

Although FIGS. 17A to 17C show the examples where the element 900 is used in the circuit 21 of FIG. 2, the element 900 can be used also in any of the circuits 21 shown in FIGS. 3A to 3D.

As described above, use of the selenium-based semiconductor as a sensor can reduce the manufacturing cost and the characteristic variation among pixels and can improve the manufacturing yield; as a result, a highly sensitive sensor can be obtained.

Therefore, by combining the structure with one embodiment of the present invention capable of lessening noise, a more accurate imaging data can be obtained.

This embodiment can be combined with any other embodiment as appropriate.

Embodiment 7

In this embodiment, a structure of an oxide semiconductor that can be used for an OS transistor is described.

In this specification, the term "parallel" indicates that the angle formed between two straight lines is greater than or equal to −10° and less than or equal to 10°, and accordingly also includes the case where the angle is greater than or equal to −5° and less than or equal to 5°. A term "substantially parallel" indicates that the angle formed between two straight lines is greater than or equal to −30° and less than or equal to 30°. In addition, the term "perpendicular" indicates that the angle formed between two straight lines is greater than or equal to 80° and less than or equal to 100°, and accordingly also includes the case where the angle is greater than or equal to 85° and less than or equal to 95°. A term "substantially perpendicular" indicates that the angle formed between two straight lines is greater than or equal to 60° and less than or equal to 120°. In this specification, trigonal and rhombohedral crystal systems are included in a hexagonal crystal system.

A structure of an oxide semiconductor film is described below.

An oxide semiconductor film is classified into, for example, a non-single-crystal oxide semiconductor film and a single crystal oxide semiconductor film. Alternatively, an oxide semiconductor is classified into, for example, a crystalline oxide semiconductor and an amorphous oxide semiconductor.

Examples of a non-single-crystal oxide semiconductor include a c-axis aligned crystalline oxide semiconductor (CAAC-OS), a polycrystalline oxide semiconductor, a microcrystalline oxide semiconductor, and an amorphous oxide semiconductor. In addition, examples of a crystalline oxide semiconductor include a single crystal oxide semiconductor, a CAAC-OS, a polycrystalline oxide semiconductor, and a microcrystalline oxide semiconductor.

<CAAC-OS>

A CAAC-OS film is one of oxide semiconductor films having a plurality of c-axis aligned crystal parts.

With a transmission electron microscope (TEM), a combined analysis image (also referred to as a high-resolution TEM image) of a bright-field image and a diffraction pattern of the CAAC-OS film is observed. Consequently, a plurality of crystal parts are observed clearly. However, even in the high-resolution TEM image, a boundary between the crystal parts, that is, a grain boundary is not clearly observed. Thus, in the CAAC-OS film, a reduction in electron mobility due to the grain boundary is less likely to occur.

According to the high-resolution cross-sectional TEM image of the CAAC-OS film observed in a direction substantially parallel to a sample surface, metal atoms are arranged in a layered manner in the crystal parts. Each metal atom layer has a morphology reflecting a surface over which the CAAC-OS film is formed (hereinafter, a surface over which the CAAC-OS film is formed is referred to as a formation surface) or a top surface of the CAAC-OS film, and is arranged parallel to the formation surface or the top surface of the CAAC-OS film.

On the other hand, according to the high-resolution planar TEM image of the CAAC-OS film observed in a direction substantially perpendicular to the sample surface, metal atoms are arranged in a triangular or hexagonal configuration in the crystal parts. However, there is no regularity of arrangement of metal atoms between different crystal parts.

A CAAC-OS film is subjected to structural analysis with an X-ray diffraction (XRD)) apparatus. For example, when the CAAC-OS film including an InGaZnO$_4$ crystal is analyzed by an out-of-plane method, a peak will appear when the diffraction angle (2θ) is around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

Note that when the CAAC-OS film with an InGaZnO$_4$ crystal is analyzed by an out-of-plane method, a peak of 20 may also be observed at around 360, in addition to the peak of 2θ at around 31°. The peak of 20 at around 360 indicates that a crystal having no c-axis alignment is included in part of the CAAC-OS film. It is preferable that in the CAAC-OS film, a peak of 20 appear at around 310 and a peak of 2θ not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Further, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and a density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). In addition, the highly purified intrinsic or substantially highly purified intrinsic oxide semiconductor film has few carrier traps. Accordingly, the transistor including the oxide semiconductor film has little variation in electrical characteristics and high reliability. Electric charge trapped by the carrier traps in the oxide semiconductor film takes a long time to be released, and might behave like fixed electric charge. Thus, the transistor which includes the oxide semiconductor film having high impurity concentration and a high density of defect states has unstable electrical characteristics in some cases.

With the use of the CAAC-OS film in a transistor, variation in the electrical characteristics of the transistor due to irradiation with visible light or ultraviolet light is small.

<Microcrystalline Oxide Semiconductor Film>

A microcrystalline oxide semiconductor film has a region where a crystal part is observed in a high resolution TEM image and a region where a crystal part is not clearly observed in a high resolution TEM image. In most cases, a crystal part in the microcrystalline oxide semiconductor film is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 am and less than or equal to 3 nm is specifically referred to as nanocrystal (nc). An oxide semiconductor film including nanocrystal is referred to as an nc-OS (nanocrystalline oxide semiconductor) film. In a high resolution TEM image of the nc-OS film, for example, a grain boundary cannot be found clearly in the nc-OS film in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. Note that there is no regularity of crystal orientation between different crystal parts in the nc-OS film. Thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than that of a crystal part, a peak which shows a crystal plane does not appear. Further, a diffraction pattern like a halo pattern appears in a selected-area electron diffraction pattern of the nc-OS film that is obtained by using an electron beam having a probe diameter (e.g., larger than or equal to 50 nm) larger than the diameter of a crystal part. Meanwhile, spots are shown in a nanobeam electron diffraction pattern of the nc-OS film obtained by using an electron beam having a probe diameter close to, or smaller than the diameter of a crystal part. Further, in a nanobeam electron diffraction pattern of the nc-OS film, regions with high luminance in a circular (ring) pattern are shown in some cases. Also in a nanobeam electron diffraction pattern of the nc-OS film, a plurality of spots is shown in a ring-like region in some cases.

The nc-OS film is an oxide semiconductor film that has high regularity as compared to an amorphous oxide semiconductor film. Therefore, the nc-OS film has a lower density of defect states than an amorphous oxide semiconductor film. However, there is no regularity of crystal orientation between different crystal parts in the nc-OS film; hence, the nc-OS film has a higher density of defect states than the CAAC-OS film.

<Amorphous Oxide Semiconductor Film>

An amorphous oxide semiconductor film has disordered atomic arrangement and no crystal part. For example, the amorphous oxide semiconductor film does not have a specific state as in quartz.

In the high-resolution TEM image of the amorphous oxide semiconductor film, crystal parts cannot be found.

When the amorphous oxide semiconductor film is subjected to structural analysis by an out-of-plane method with an XRD apparatus, a peak which shows a crystal plane does not appear. A halo pattern is shown in an electron diffraction pattern of the amorphous oxide semiconductor film. Further, a halo pattern is shown but a spot is not shown in a nanobeam electron diffraction pattern of the amorphous oxide semiconductor film.

Note that an oxide semiconductor film may have a structure having physical properties between the nc-OS film and the amorphous oxide semiconductor film. The oxide semiconductor film having such a structure is specifically referred to as an amorphous-like oxide semiconductor (a-like OS) film.

In a high-resolution TEM image of the a-like OS film, a void may be seen. Furthermore, in the high-resolution TEM image, there are a region where a crystal part is clearly observed and a region where a crystal part is not observed. In the a-like OS film, crystallization by a slight amount of electron beam used for TEM observation occurs and growth of the crystal part is found sometimes. In contrast, crystallization by a slight amount of electron beam used for TEM observation is less observed in the nc-OS film having good quality.

Note that the crystal part size in the a-like OS film and the nc-OS film can be measured using high-resolution TEM images. For example, an $InGaZnO_4$ crystal has a layered structure in which two Ga—Zn—O layers are included between In—O layers. A unit cell of the $InGaZnO_4$ crystal has a structure in which nine layers of three In—O layers and six Ga—Zn—O layers are layered in the c-axis direction. Accordingly, the spacing between these adjacent layers is equivalent to the lattice spacing on the (009) plane (also referred to as d value). The value is calculated to 0.29 nm from crystal structure analysis. Thus, each of the lattice fringes in which the spacing therebetween is from 0.28 nm to 0.30 nm corresponds to the a-b plane of the $InGaZnO_4$ crystal, when focusing on the lattice fringes in the high-resolution TEM image.

The density of an oxide semiconductor film might vary depending on its structure. For example, if the composition of an oxide semiconductor film is determined, the structure of the oxide semiconductor film can be estimated from a comparison between the density of the oxide semiconductor film and the density of a single crystal oxide semiconductor having the same composition as the oxide semiconductor film. For example, the density of the a-like OS film is higher than or equal to 78.6% and lower than 92.3% of the density of the single crystal oxide semiconductor having the same composition. For example, the density of each of the nc-OS film and the CAAC-OS film is higher than or equal to 92.3% and lower than 100% of the density of the single crystal oxide semiconductor having the same composition. Note that it is difficult to deposit an oxide semiconductor film whose density is lower than 78% of the density of the single crystal oxide semiconductor film.

Specific examples of the above description are given. For example, in the case of an oxide semiconductor film with an atomic ratio of In:Ga:Zn=1:1:1, the density of single-crystal $InGaZnO_4$ with a rhombohedral crystal structure is 6.357 $g/cm^3$. Thus, for example, in the case of the oxide semiconductor film with an atomic ratio of In:Ga:Zn=1:1:1, the density of an a-like OS film is higher than or equal to 5.0 $g/cm^3$ and lower than 5.9 $g/cm^3$. In addition, for example, in the case of the oxide semiconductor film with an atomic ratio of In:Ga:Zn=1:1:1, the density of an nc-OS film or a CAAC-OS film is higher than or equal to 5.9 $g/cm^3$ and lower than 6.3 $g/cm^3$.

Note that single crystals with the same composition do not exist in some cases. In such a case, by combining single crystals with different compositions at a given proportion, it is possible to calculate density that corresponds to the density of a single crystal with a desired composition. The density of the single crystal with a desired composition may be calculated using weighted average with respect to the combination ratio of the single crystals with different compositions. Note that it is preferable to combine as few kinds of single crystals as possible for density calculation.

Note that an oxide semiconductor film may be a stacked film including two or more films of an amorphous oxide semiconductor film, an a-like OS film, a microcrystalline oxide semiconductor film, and a CAAC-OS film, for example.

This embodiment can be combined with any other embodiment as appropriate.

Embodiment 8

In this embodiment, examples of an electronic device including the imaging device of one embodiment of the present invention are described.

Examples of an electronic device including the imaging device of one embodiment of the present invention are as follows: display devices such as televisions and monitors, lighting devices, desktop personal computers and laptop personal computers, word processors, image reproduction devices which reproduce still images and moving images stored in recording media such as digital versatile discs (DVDs), portable CD players, radios, tape recorders, headphone stereos, stereos, navigation systems, table clocks, wall clocks, cordless phone handsets, transceivers, mobile phones, car phones, portable game machines, tablet terminals, large game machines such as pinball machines, calculators, portable information terminals, electronic notebooks, e-book readers, electronic translators, audio input devices, video cameras, digital still cameras, electric shavers, high-frequency heating appliances such as microwave ovens, electric rice cookers, electric washing machines, electric vacuum cleaners, water heaters, electric fans, hair dryers, air-conditioning systems such as air conditioners, humidifiers, and dehumidifiers, dishwashers, dish dryers, clothes dryers, futon dryers, electric refrigerators, electric freezers, electric refrigerator-freezers, freezers for preserving DNA, flashlights, electric power tools such as chain saws, smoke detectors, medical equipment such as dialyzers, facsimiles, printers, multifunction printers, automated teller machines (ATM), and vending machines. Further, industrial equipment such as guide lights, traffic lights, belt conveyors, elevators, escalators, industrial robots, power storage systems, and power storage devices for leveling the amount of power supply and smart grid can be given. In addition, moving objects and the like driven by fuel engines and electric motors using power from non-aqueous secondary batteries are also included in the category of electronic devices. Examples of the moving objects included in the category of an electronic device are electric vehicles (EV), hybrid electric vehicles (HEV) which include both an internal-combustion engine and a motor, plug-in hybrid electric vehicles (PHEV), tracked vehicles in which caterpillar tracks are substituted for wheels of these vehicles, motorized bicycles including motor-assisted bicycles, motorcycles, electric wheelchairs, golf carts, boats, ships, submarines, helicopters, aircrafts, rockets, artificial satellites, space probes, planetary probes, and spacecrafts.

Figure 18A:
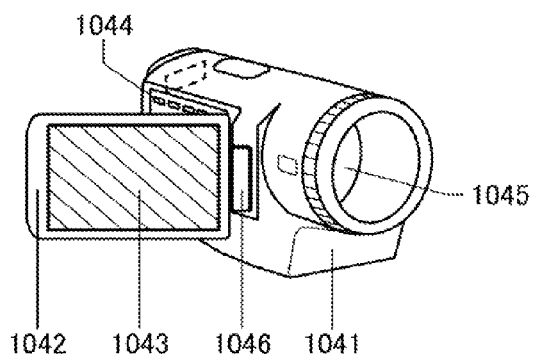
FIGS. 18A to 18F each illustrate an electronic device.

FIG. 18A illustrates a video camera, which includes a first housing 1041, a second housing 1042, a display portion 1043, operation keys 1044, a lens 1045, a joint 1046, and the like. The operation keys 1044 and the lens 1045 are provided for the first housing 1041, and the display portion 1043 is provided for the second housing 1042. The first housing 1041 and the second housing 1042 are connected to each other with the joint 1046, and an angle between the first housing 1041 and the second housing 1042 can be changed with the joint 1046. Images displayed on the display portion 1043 may be switched in accordance with the angle at the joint 1046 between the first housing 1041 and the second housing 1042. The imaging device of one embodiment of the present invention can be provided in a focus position of the lens 1045.

Figure 18B:
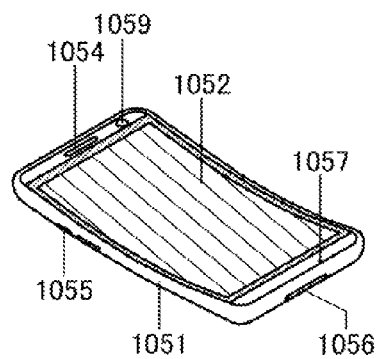

FIG. 18B illustrates a mobile phone which includes a display portion 1052, a microphone 1057, a speaker 1054, a camera 1059, an input-output terminal 1056, an operation button 1055, and the like in a housing 1051. For the camera 1059, the imaging device of one embodiment of the present invention can be used.

Figure 18C:
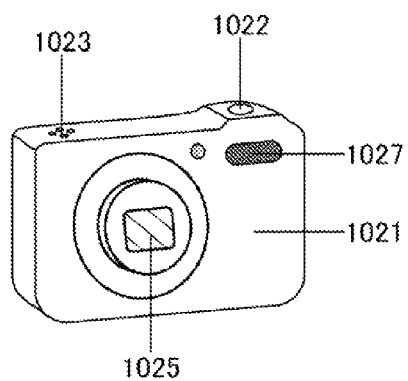

FIG. 18C illustrates a digital camera which includes a housing 1021, a shutter button 1022, a microphone 1023, a light-emitting portion 1027, a lens 1025, and the like. The imaging device of one embodiment of the present invention can be provided in a focus position of the lens 1025.

Figure 18D:
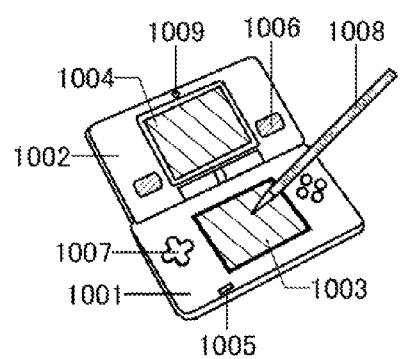

FIG. 18D illustrates a portable game machine which includes a housing 1001, a housing 1002, a display portion 1003, a display portion 1004, a microphone 1005, a speaker 1006, an operation key 1007, a stylus 1008, a camera 1009, and the like. Although the portable game machine illustrated in FIG. 18D has the two display portions 1003 and 1004, the number of display portions included in the portable game machine is not limited to this. The imaging device of one embodiment of the present invention can be used for the camera 1009.

Figure 18E:
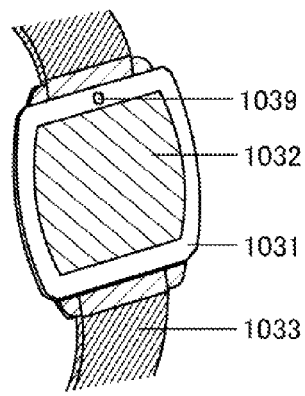

FIG. 18E illustrates a wrist-watch-type information terminal which includes a housing 1031, a display portion 1032, a wristband 1033, a camera 1039, and the like. The display portion 1032 may be a touch panel. The imaging device of one embodiment of the present invention can be used for the camera 1039.

Figure 18F:
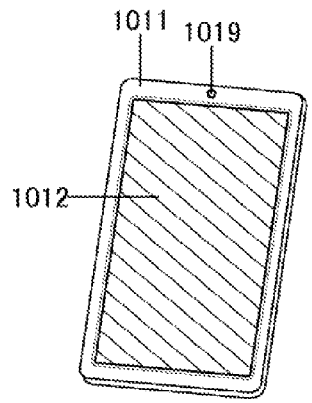

FIG. 18F illustrates a portable data terminal which includes a first housing 1011, a display portion 1012, a camera 1019, and the like. A touch panel function of the display portion 1012 enables input and output of information. The imaging device of one embodiment of the present invention can be used for the camera 1019.

Needless to say, one embodiment of the present invention is not limited to the above-described electronic devices as long as the imaging device of one embodiment of the present invention is included.

This embodiment can be combined with any other embodiment as appropriate.

This application is based on Japanese Patent Application serial no. 2014-147695 filed with Japan Patent Office on Jul. 18, 2014, the entire contents of which are hereby incorporated by reference.

What is claimed is:

1. A semiconductor device comprising:
a first circuit comprising a photoelectric conversion element;
a second circuit;
a third circuit; and
a fourth circuit,
wherein the first circuit has a function of generating a first signal in accordance with the amount of light entering the photoelectric conversion element and a function of generating a second signal corresponding to a reset state of the first circuit,
wherein the second circuit has a function of controlling output of the first signal and the second signal from the first circuit to the fourth circuit,
wherein the third circuit has a function of controlling generation of the second signal to be output from the first circuit to the fourth circuit, and
wherein the fourth circuit has a function of calculating a difference between the first signal from the first circuit and the second signal from the first circuit after input of the first signal.

2. The semiconductor device according to claim 1,
wherein the fourth circuit comprises a capacitor,
wherein the first signal and the second signal are input to one of electrodes of the capacitor, and
wherein a potential of the other of the electrodes of the capacitor changes in accordance with the second signal.

3. The semiconductor device according to claim 1,
wherein the first circuit comprises a first transistor and a second transistor,
wherein one of a source and a drain of the first transistor is electrically connected to the photoelectric conversion element, and
wherein the other of the source and the drain of the first transistor is electrically connected to a gate of the second transistor.

4. The semiconductor device according to claim 3,
wherein a channel formation region of the first transistor comprises an oxide semiconductor.

5. The semiconductor device according to claim 1,
wherein the semiconductor device has a function of performing exposure and reading with a global shutter system.

6. The semiconductor device according to claim 1, further comprising a light-emitting element.

7. An imaging device comprising:
a photodetector portion comprising the semiconductor device according to claim 1; and
a data processing portion having a function of generating an image data on the basis of a signal from the photodetector portion.

8. An electronic device comprising:
the imaging device according to claim 7; and
any of a lens, a display portion, an operation key and a shutter button.

9. A semiconductor device comprising:
a first circuit comprising a plurality of pixels arranged in a matrix having n rows and m columns (m and n are each a natural number greater than or equal to 1), each of the plurality of pixels comprising a photoelectric conversion element;
a second circuit comprising n first wirings;
a third circuit comprising n second wirings; and
a fourth circuit,
wherein one of the plurality of pixels comprises a first transistor, a second transistor, a third transistor and a fourth transistor,
wherein one of a source and a drain of the first transistor is electrically connected to the photoelectric conversion element,
wherein the other of the source and the drain of the first transistor and one of a source and a drain of the third transistor is electrically connected to a gate of the second transistor,
wherein one of a source and a drain of the second transistor is electrically connected to one of a source and a drain of the fourth transistor,
wherein a gate of the third transistor is electrically connected to one of the n second wirings,
wherein a gate of the fourth transistor is electrically connected to one of the n first wirings,
wherein the fourth circuit comprises a capacitor, and
wherein the other of the source and the drain of the fourth transistor is electrically connected to one of electrodes of the capacitor.

10. The semiconductor device according to claim 9,
wherein the one of the plurality of pixels has a function of generating a first signal in accordance with the amount of light entering the photoelectric conversion element and a function of generating a second signal corresponding to a reset state of the first circuit,
wherein the second circuit has a function of controlling output of the first signal and the second signal from the first circuit to the fourth circuit,
wherein the third circuit has a function of controlling generation of the second signal to be output from the first circuit to the fourth circuit, and
wherein the fourth circuit has a function of calculating a difference between the first signal input from the first circuit and the second signal input from the first circuit after input of the first signal.

11. The semiconductor device according to claim 9,
wherein a channel formation region of the first transistor comprises an oxide semiconductor.

12. The semiconductor device according to claim 9,
wherein a channel formation region of the third transistor comprises an oxide semiconductor.

13. The semiconductor device according to claim 9,
wherein the semiconductor device has a function of performing exposure and reading with a global shutter system.

14. The semiconductor device according to claim 9, further comprising a light-emitting element provided in each of the plurality of pixels.

15. An imaging device comprising:
a photodetector portion comprising the semiconductor device according to claim 9; and
a data processing portion having a function of generating an image data on the basis of a signal from the photodetector portion.

16. An electronic device comprising:
the imaging device according to claim 15; and
any of a lens, a display portion, an operation key and a shutter button.

* * * * *